(12) United States Patent
Mori et al.

(10) Patent No.: US 7,868,345 B2
(45) Date of Patent: Jan. 11, 2011

(54) LIGHT EMITTING DEVICE MOUNTING SUBSTRATE, LIGHT EMITTING DEVICE HOUSING PACKAGE, LIGHT EMITTING APPARATUS, AND ILLUMINATING APPARATUS

(75) Inventors: Yuki Mori, Higashiomi (JP); Fumiaki Sekine, Mito (JP)

(73) Assignee: Kyocera Corporation, Kyoto (JP)

( * ) Notice: Subject to any disclaimer, the term of this patent is extended or adjusted under 35 U.S.C. 154(b) by 281 days.

(21) Appl. No.: 11/718,217

(22) PCT Filed: Oct. 27, 2005

(86) PCT No.: PCT/JP2005/019811
§ 371 (c)(1),
(2), (4) Date: Dec. 2, 2008

(87) PCT Pub. No.: WO2006/046655
PCT Pub. Date: May 4, 2006

(65) Prior Publication Data
US 2009/0200570 A1 Aug. 13, 2009

(30) Foreign Application Priority Data

| Oct. 27, 2004 | (JP) | ................. 2004-312169 |
| Oct. 28, 2004 | (JP) | ................. 2004-314234 |
| Jan. 24, 2005 | (JP) | ................. 2005-016052 |
| Feb. 24, 2005 | (JP) | ................. 2005-049629 |

(51) Int. Cl.
*H01L 33/00* (2010.01)
(52) U.S. Cl. .................. 257/99; 257/E33.075
(58) Field of Classification Search ............ 257/99, 257/100, 79, E33.075, E33.061, 81, 676, 257/678; 438/26, 29, 313
See application file for complete search history.

(56) References Cited

U.S. PATENT DOCUMENTS 6,281,524 B1   8/2001 Yamamoto et al.

(Continued)

FOREIGN PATENT DOCUMENTS

JP           10294493 A        11/1998

(Continued)

OTHER PUBLICATIONS

INFINEON, "Thermal Resistance. Theory and Practice", 2000, pp. 1-33.*

(Continued)

*Primary Examiner*—Thomas L Dickey
*Assistant Examiner*—Nikolay Yushin
(74) *Attorney, Agent, or Firm*—DLA Piper LLP (US)

(57) ABSTRACT

A light-emitting apparatus with improved dissipation efficiency of heat transmitted to a specific electrode of a light-emitting device is provided. A light-emitting device mounting substrate used for the light emitting apparatus include a base body (1) which mounts thereon a light-emitting device (3); a first electrically conductive path (L1) formed within the base body (1), one end thereof being electrically connected to a first electrode (3a) of the light-emitting device (3) and the other end thereof being led out to a surface of the base body (1); and a second electrically conductive path (L2) formed in the base body (1), one end thereof being electrically connected to a second electrode (3b) of the light-emitting device (3), and the other end thereof being formed on the surface of the base body (1). The first electrically conductive path (L1) is made smaller in thermal resistance than the second electrically conductive path (L2).

2 Claims, 21 Drawing Sheets

U.S. PATENT DOCUMENTS

| | | | |
|---|---|---|---|
| 2001/0024460 A1 | 9/2001 | Yamamoto et al. | |
| 2003/0189829 A1* | 10/2003 | Shimizu et al. | 362/240 |
| 2004/0012964 A1* | 1/2004 | Makuta | 362/294 |
| 2004/0079957 A1* | 4/2004 | Andrews et al. | 257/100 |
| 2004/0188696 A1 | 9/2004 | Hsing Chen et al. | |
| 2005/0139846 A1 | 6/2005 | Park et al. | |
| 2005/0156187 A1* | 7/2005 | Isokawa et al. | 257/100 |
| 2006/0006404 A1* | 1/2006 | Ibbetson et al. | 257/99 |
| 2006/0198162 A1* | 9/2006 | Ishidu et al. | 362/623 |

FOREIGN PATENT DOCUMENTS

| | | | |
|---|---|---|---|
| JP | 2001-223391 | * | 8/2001 |
| JP | 2001223391 A | | 8/2001 |
| JP | 2002-222999 A | | 8/2002 |
| JP | 2003-101076 | | 4/2003 |
| JP | 2003264267 A | | 9/2003 |
| JP | 2003324214 A | | 11/2003 |
| JP | 2004259901 A | | 9/2004 |
| WO | WO2004084319 | * | 3/2004 |
| WO | 2004084319 A | | 9/2004 |

OTHER PUBLICATIONS

European search report for corresponding European application 05805336.4 lists the references above, Dec. 14, 2009.

Japanese language office action dated Sep. 14, 2010 and its English language translation for corresponding Japanese application 2006-543257.

* cited by examiner

LIGHT EMITTING DEVICE MOUNTING SUBSTRATE, LIGHT EMITTING DEVICE HOUSING PACKAGE, LIGHT EMITTING APPARATUS, AND ILLUMINATING APPARATUS

TECHNICAL FIELD

The present invention relates to a substrate for mounting thereon a light-emitting device such as a light-emitting diode (LED for short), a package for housing a light-emitting device, and a light-emitting apparatus, as well as to an illuminating apparatus incorporating such components.

BACKGROUND ART

In a light-emitting apparatus of conventional design, a light-emitting device such as a light-emitting diode is mounted on a base body, and is provided with a reflection surface so as to surround the light-emitting device. Moreover, an inside of the reflection surface is filled with a light-transmittable member so as to cover the light-emitting device. On the light-emitting device is formed a wavelength converting layer containing a phosphor for converting the wavelength of light emitted from the light-emitting device. The base body is provided with an electrically conductive path formed of a wiring conductor or a via conductor that is electrically connected to an electrode of the light-emitting device.

In this light-emitting apparatus, light is emitted from the light-emitting device through application of a driving current which is fed from an external electric circuit, and the light is then subjected to wavelength conversion. The wavelength-converted light is emitted as visible light from the light-emitting apparatus. Note that Japanese Unexamined Patent Publication JP-A 2003-101076 discloses a related art.

The amount of heat liberated by a light-emitting device is expected to be on the increase in the years ahead. Particularly, in a light-emitting device having a plurality of electrodes formed in it, of these electrodes, a specific one tends to receive transmission of an increasingly larger amount of heat. If the light-emitting device undergoes accumulation of heat and an ensuing significant temperature rise, there arises a problem of deterioration in luminous efficiency.

DISCLOSURE OF INVENTION

The invention has been devised in view of the above-described problem with the conventional art, and accordingly its object is to provide a light-emitting apparatus that succeeds in dissipating heat transmitted to a specific electrode of a light-emitting device with higher heat-dissipation efficiency.

The invention provides a light-emitting device mounting substrate comprising:

a base body which mounts thereon a light-emitting device;

a first electrically conductive path formed within the base body, one end of the first electrically conductive path being electrically connected to a first electrode of the light-emitting device, and the other end thereof being led out to a surface of the base body; and a second electrically conductive path formed in the base body, one end of the second electrically conductive path being electrically connected to a second electrode of the light-emitting device, and the other end thereof being formed on the surface of the base body, wherein the first electrically conductive path is made smaller in thermal resistance than the second electrically conductive path.

In the invention, it is preferable that the first electrically conductive path and the second electrically conductive path are composed of a first via conductor and a second via conductor, respectively, that are each formed by filling a via hole provided in the base body with an electrically conductive material.

In the invention, it is preferable that an area of interface between the first via conductor constituting the first electrically conductive path and the base body is set to be larger than an area of interface between the second via conductor constituting the second electrically conductive path and the base body.

In the invention, it is preferable that an area of joint region between the first electrically conductive path and the first electrode of the light-emitting device is set to be larger than the area of joint region between the second electrically conductive path and the second electrode of the light-emitting device.

In the invention, it is preferable that the one end of the first electrically conductive path which is joined to the first electrode of the light-emitting device is so shaped as to have a convex surface.

In the invention, it is preferable that the one end of the first electrically conductive path which is joined to the first electrode of the light-emitting device is so shaped as to have a concave surface.

In the invention, it is preferable that the first electrically conductive path and the first electrode of the light-emitting device are connected to each other via a first connection pad and the second electrically conductive path and the second electrode of the light-emitting device are connected to each other via a second connection pad, and that the first connection pad is made larger in area than the second connection pad.

In the invention, it is preferable that the first electrically conductive path includes a plurality of electrical conductors which are joined to the first electrode of the light-emitting device.

In the invention, it is preferable that a total area of joint region between the first electrode of the light-emitting device and each of a plurality of the electrical conductors is set to be larger than the total area of joint region between the first electrode of the light-emitting device and the base body.

In the invention, it is preferable that the electrical conductor is so shaped that across-sectional area thereof becomes larger gradually from one end to be joined to the first electrode of the light-emitting device to the other end.

In the invention, it is preferable that the first electrically conductive path includes a plurality of column-shaped metal bodies, one ends of which are joined to the first electrode of the light-emitting device.

In the invention, it is preferable that a hole is formed on a surface of the base body which mounts thereon the light-emitting device, and a part of the first electrically conductive path is exposedly located inside the hole.

In the invention, it is preferable that a distance between the first and second electrically conductive paths on a common plane is set to be longer than a distance between the first and second electrodes of the light-emitting device that are joined to the base body.

In the invention, it is preferable that the first electrically conductive path and the first electrode of the light-emitting device are connected to each other via a first connection pad and the second electrically conductive path and the second electrode of the light-emitting device are connected to each other via a second connection pad, and that the first electrically conductive path is placed immediately below the first connection pad, whereas the second electrically conductive path is placed outwardly of a region immediately below the second connection pad.

The invention provides a light-emitting device mounting substrate comprising:

a base body which mounts thereon a light-emitting device;

a first via conductor formed within the base body, one end of the first via conductor being electrically connected to a first electrode of the light-emitting device; and a second via conductor formed in the base body, one end of the second via conductor being electrically connected to a second electrode of the light-emitting device, wherein the area of connection between the first via conductor and the first electrode is set to be larger than the area of connection between the second via conductor and the second electrode.

The invention provides a light-emitting device mounting substrate comprising:

a base body which mounts thereon a light-emitting device;

a first via conductor formed within the base body, one end of the first via conductor being electrically connected to a first electrode of the light-emitting device; and a second via conductor formed in the base body, one end of the second via conductor being electrically connected to a second electrode of the light-emitting device, wherein the first via conductor is composed of a plurality of electrical conductors.

The invention provides a light-emitting device housing package comprising:

a base body which mounts thereon a light-emitting device;

a first electrically conductive path formed within the base body, one end of the first electrically conductive path being electrically connected to a first electrode of the light-emitting device, and the other end thereof being led out to a surface of the base body;

a second electrically conductive path formed in the base body, one end of the second electrically conductive path being electrically connected to a second electrode of the light-emitting device, and the other end thereof being formed on the surface of the base body; and a light reflection portion formed so as to surround the light-emitting device, wherein the first electrically conductive path is made smaller in thermal resistance than the second electrically conductive path.

The invention provides a light-emitting apparatus comprising:

a light-emitting device;

a base body having mounted thereon the light-emitting device;

a first electrically conductive path formed within the base body, one end of the first electrically conductive path being electrically connected to a first electrode of the light-emitting device, and the other end thereof being led out to a surface of the base body;

a second electrically conductive path formed in the base body, one end of the second electrically conductive path being electrically connected to a second electrode of the light-emitting device, and the other end thereof being formed on the surface of the base body; and a light reflection portion formed so as to surround the light-emitting device, wherein the first electrically conductive path is made smaller in thermal resistance than the second electrically conductive path.

In the invention, it is preferable that a hole is formed on a surface of the base body having mounted thereon the light-emitting device, and a part of the first electrically conductive path is led out into the hole, and that the led-out portion of the first electrically conductive path and the first electrode of the light-emitting device are electrically connected to each other via a connecting agent, a part of which penetrates into the hole.

In the invention, it is preferable that the first electrode is formed on a light-emitting layer of the light-emitting device.

In the invention, it is preferable that the base body is made of ceramics, and the light-emitting device is made of an inorganic material.

In the invention, it is preferable that an inside of the light reflection portion is filled with a light-transmittable member so as to cover the light-emitting device.

In the invention, it is preferable that the light-transmittable member is made of silicone resin.

In the invention, it is preferable that a wavelength converting member for effecting wavelength conversion on light emitted from the light-emitting device is formed inside the light reflection portion so as to cover the light-emitting device.

The invention provides a light-emitting apparatus comprising:

a light-emitting device;

a base body having mounted thereon the light-emitting device, a first via conductor formed within the base body, one end of the first via conductor being electrically connected to a first electrode of the light-emitting device;

a second via conductor formed in the base body, one end of the second via conductor being electrically connected to a second electrode of the light-emitting device; and a light reflection portion formed so as to surround the light-emitting device, wherein the area of connection between the first via conductor and the first electrode is set to be larger than the area of connection between the second via conductor and the second electrode.

The invention provides a light-emitting apparatus comprising:

a light-emitting device;

a base body having mounted thereon the light-emitting device;

a first via conductor formed within the base body, one end of the first via conductor being electrically connected to a first electrode of the light-emitting device;

a second via conductor formed in the base body, one end of the second via conductor being electrically connected to a second electrode of the light-emitting device; and a light reflection portion formed so as to surround the light-emitting device, wherein the first via conductor is composed of a plurality of electrical conductors.

The invention provides an illuminating apparatus incorporating the above-described light-emitting apparatus as a light source.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1A:
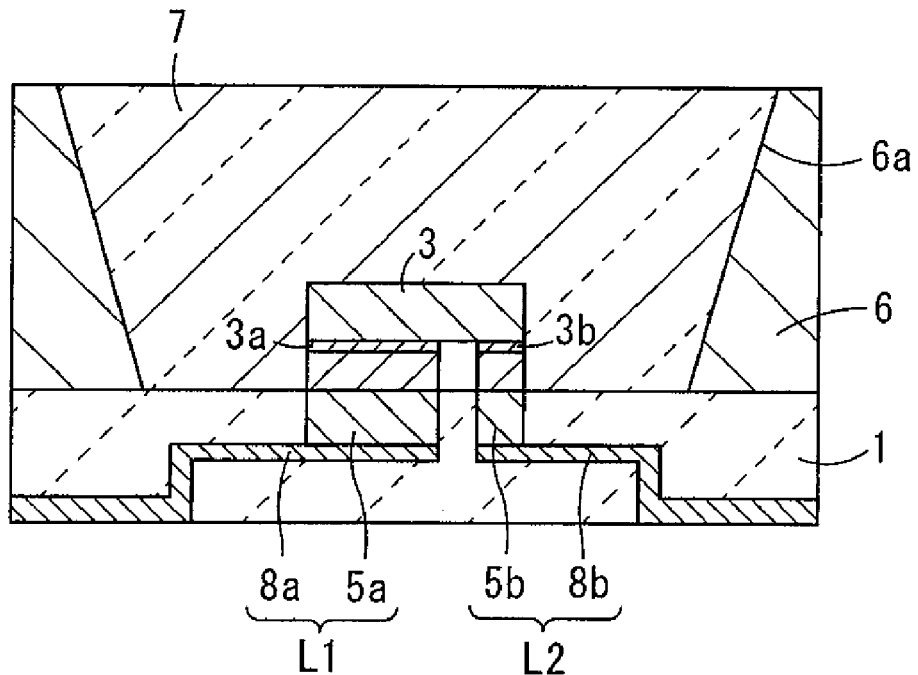
FIGS. 1A and 1B are sectional views showing an example of a light-emitting apparatus in accordance with a first embodiment of the invention.

Now referring to the drawings, preferred embodiments of the invention are described below.

First Embodiment

Figure 1B:
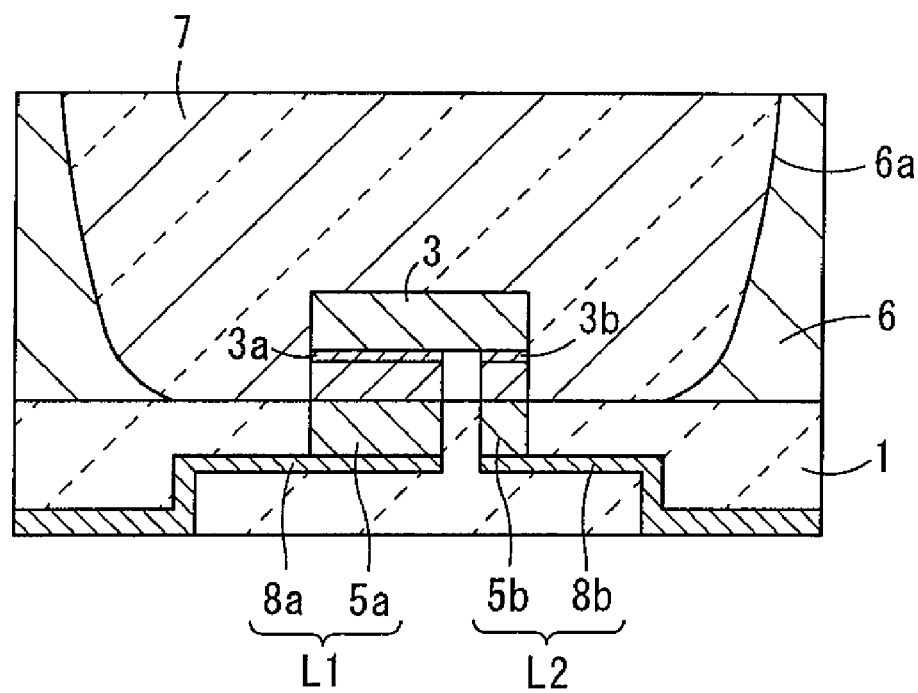
Figure 2A:
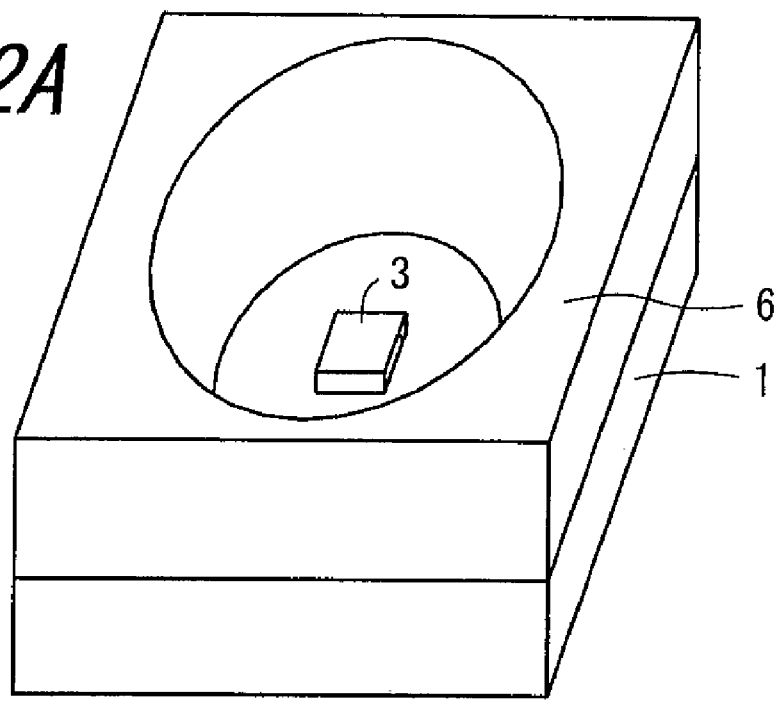
FIG. 2A is a perspective view of the light-emitting apparatus depicted in FIG. 1A.
Figure 2B:
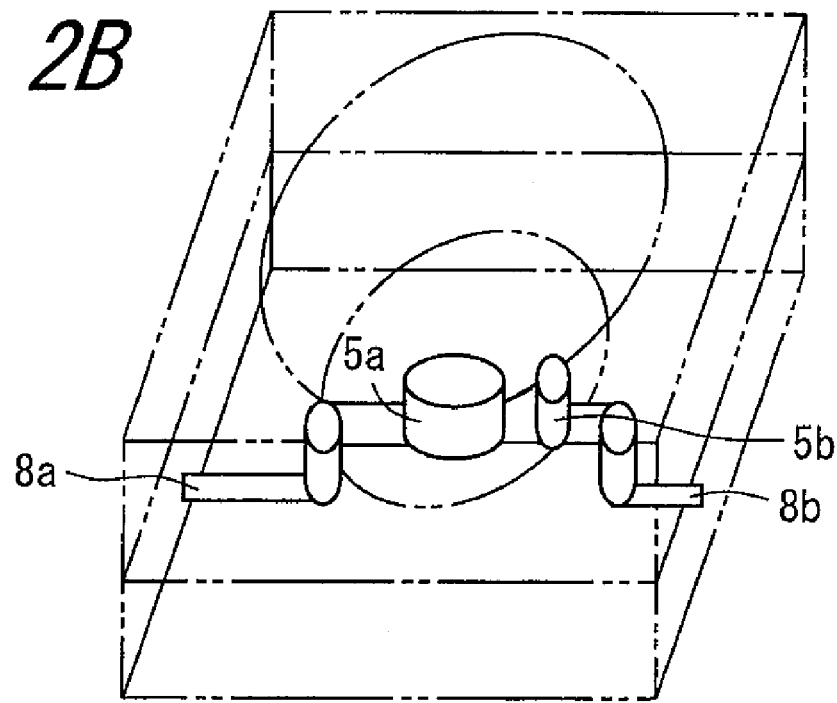
FIG. 2B is a perspective transparent view showing the configuration of a first and a second electrically conductive path of the light-emitting apparatus depicted in FIG. 1A.

FIGS. 1A and 1B are sectional views showing a light-emitting apparatus incorporating a light-emitting device mounting substrate in accordance with a first embodiment of the invention. FIG. 2A is a perspective view of the light-emitting apparatus depicted in FIG. 1A. FIG. 2B is a perspective transparent view showing the configuration of a first and a second electrically conductive path of the light-emitting apparatus depicted in FIG. 1A.

As shown in FIG. 1A, in the light-emitting apparatus of the first embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2. Herein, the thermal resistance refers to a value representing a rise in temperature per unit electric power. The base body 1 is made of a ceramic material such as alumina ceramic, sintered aluminum nitride, sintered mullite, or glass ceramic, or a resin material such as epoxy resin, or a metal material. The base body 1 functions as a support member for supporting the light-emitting device 3.

In the case of constituting the base body 1 with use of ceramic, it is possible to impart higher strength to the base body 1 as compared with the case of using resin. Moreover, in the case of constituting the base body 1 with use of an electrically conductive material, for example, an insulating layer is disposed around the first and second electrically conductive paths in a surrounding manner. This makes it possible to provide electrical isolation between the base body 1 and the first and second electrically conductive paths L1 and L2.

The first electrically conductive path L1 is composed of a first via conductor 5a and a wiring conductor 8a. The first via conductor 5a is formed by filling a via hole provided in the base body 1 with an electrically conductive material. The first electrically conductive path L1 has one end thereof electrically connected to a first electrode 3a of the light-emitting device 3 and the other end thereof led out to a surface of the base body 1. In the construction illustrated in FIG. 1A, the other end of the first electrically conductive path L1 is led out to the mounting surface, namely the lower surface, of the base body 1.

The second electrically conductive path L2 is composed of a second via conductor 5b and a wiring conductor 8b. The second via conductor 5b is formed by filling a via hole provided in the base body 1 with an electrically conductive material. The second electrically conductive path L2 has one end thereof electrically connected to a second electrode 3b of the light-emitting device 3 and the other end thereof formed on a surface of the base body 1. In the construction illustrated in FIG. 1A, the other end of the second electrically conductive path L2 is formed on the mounting surface, namely the lower surface, of the base body 1.

The first and second electrically conductive paths L1 and L2 such as shown herein are formed by means of metallization, plating, or otherwise. The first via conductor 5a of the first electrically conductive path L1, as well as the second via conductor 5b of the second electrically conductive path L2, is made of a metal material such as W, Mo, Mn, or Cu.

The light reflection portion 6 is formed on the base body 1 so as to surround the light-emitting device 3. In the light reflection portion 6 in vertical cross section as illustrated in FIG. 1A, an inner surface 6a thereof is defined by a straight-line segment.

Figure 26:
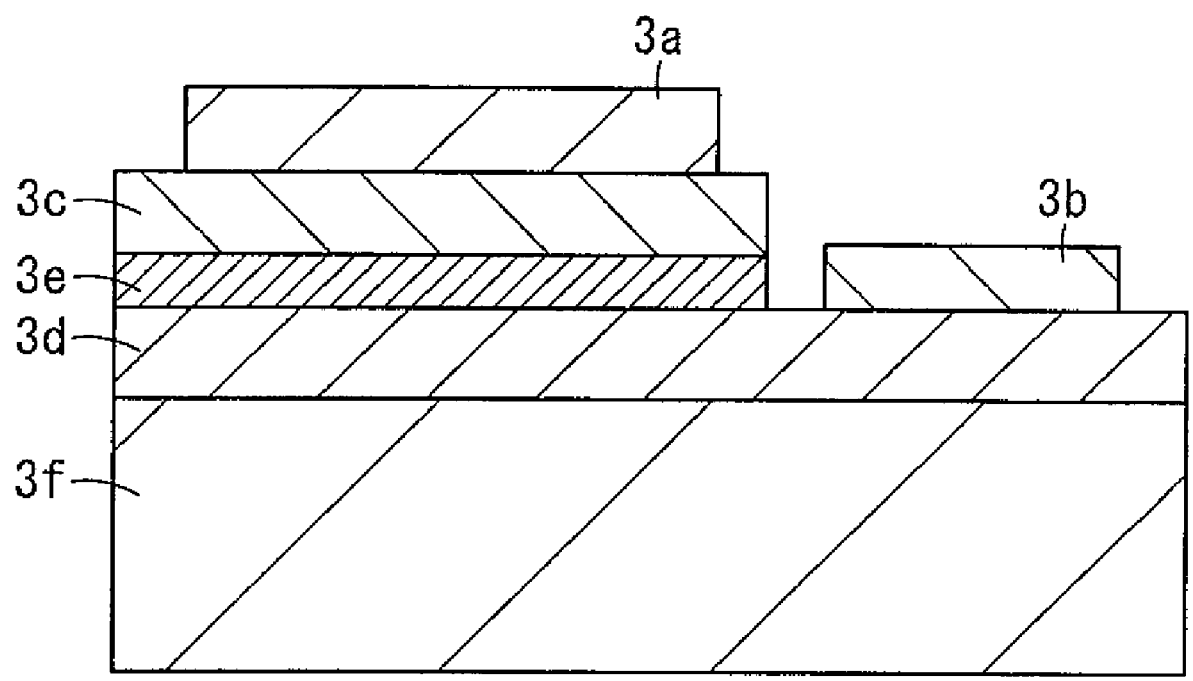
FIG. 26 is a sectional view showing the basic structure of a light-emitting device.

As illustrated in cross section in FIG. 26, the light-emitting device 3 is constructed by forming an n-type semiconductor layer 3d acting as a second electrically conductive layer on a substrate 3f, and then forming a p-type semiconductor layer 3c acting as a first electrically conductive layer on the n-type semiconductor layer 3d. Between the n-type semiconductor layer 3d and the p-type semiconductor layer 3c is interposed a light-emitting layer 3e. In FIG. 26, the first electrode 3a is positioned so as to face the p-type semiconductor layer 3c, and the second electrode 3b is disposed on the n-type semiconductor layer 3d. The first electrode 3a of the light-emitting device 3 formed opposite the light-emitting layer 3e serves also as a light reflection surface. Thus, by increasing the area of the first electrode 3a, it is possible to enhance the optical power of the light-emitting device 3.

For example, the light-emitting device 3 is composed of a gallium nitride-base compound semiconductor, or a silicone carbide-base compound semiconductor, constructed by stacking the n-type semiconductor layer 3d, the light-emitting layer 3e, and the p-type semiconductor layer 3c one after another on a sapphire substrate 3f. For example, the gallium nitride-base compound semiconductor is made of gallium (Ga)-nitride (N), Al—Ga—N, or indium (In)—GaN.

Such a light-emitting device 3 is mounted on the base body 1 so as to be electrically connected to an external circuit board by means of wire bonding (not shown) or flip-chip bonding. In the case of adopting the flip-chip bonding method, the connection is established by connecting means composed of a solder bump made of a brazing filler material or solder such as Au—Sn, Sn—Ag, Sn—Ag—Cu, or Sn—Pb, or a metal bump made of a metal material such as Au or Ag.

In the light-emitting device 3 having such a structure, since the first electrode 3a is formed so as to face the light-emitting layer 3e, there is a tendency for heat generated in the light-emitting layer 3e to be transmitted to the first electrode 3a.

In the first embodiment, the first electrically conductive path L1 is made smaller in thermal resistance than the second electrically conductive path L2. Accordingly, in the light-emitting apparatus of this embodiment, of a plurality of electrodes formed in the light-emitting device 3, a specific one which receives transmission of a larger amount of heat than others, namely the first electrode 3a, is allowed to dissipate the heat transmitted thereto with higher heat-dissipation efficiency. This contributes to enhanced luminous efficiency. Moreover, as has already been described, since the first electrode 3a is made larger in area than the second electrode 3b, it follows that the first electrode receives transmission of a larger amount of heat than does the second electrode.

That is, in the light-emitting apparatus of this embodiment, the heat transmitted to a specific electrode of the light-emitting device 3, namely the first electrode 3a, can be dissipated to the outside after being received by the first electrically conductive path L1 which is smaller in thermal resistance than the second electrically conductive path L2. This makes it possible to attain higher luminous efficiency.

Herein, in regard to the embodiment illustrated in FIG. 1A, the configuration in which the first electrically conductive path L1 is smaller in thermal resistance than the second electrically conductive path L2 refers to a configuration in which the first via conductor 5a is larger in cross-sectional area than the second via conductor 5b; that is, the first via conductor 5a is made thicker than the second via conductor 5b. Since the first via conductor 5a is made larger in cross-sectional area than the second via conductor 5b, it follows that the thermal resistance of the first via conductor 5a is lower than that of the second via conductor 5b.

As shown in FIG. 1A, in the light-emitting apparatus of this embodiment, the area of joint region between the first electrically conductive path L1 and the first electrode 3a of the light-emitting device 3 is set to be larger than the area of joint region between the second electrically conductive path L2 and the second electrode 3b of the light-emitting device 3. For example, it is preferable that the area of joint region between the first electrically conductive path L1 and the first electrode 3a of the light-emitting device 3 is set to be 4 to 30 times as large as the area of joint region between the second electrically conductive path L2 and the second electrode 3b of the light-emitting device 3. If the former is less than 4 times the latter, the heat emanating from the light-emitting device 3 cannot be readily scattered inside the base body 1 and dissipated from the light-emitting apparatus to the outside. This could lead to poor heat-dissipation capability. On the other hand, if the former is greater than 30 times the latter, it is inevitable that the first electrically conductive path L1 has an unduly large cubic volume, and undergoes significant thermal expansion correspondingly. As a result, a great stress could be concentrated in the interior of the base body 1.

It is also preferable that, on a common plane, the via conductor 5a constituting the first electrically conductive path L1 is made larger in cross-sectional area than the via conductor 5b constituting the second electrically conductive path L2. In this case, in any part of the base body 1 in cross section as viewed plane-wise, the cross-sectional area of the via conductor 5a constituting the first electrically conductive path L1 is consistently larger than that of the via conductor 5b constituting the second electrically conductive path L2. That is, in any part of the base body 1 in cross section, the first electrically conductive path L1 offers higher heat-dissipation capability than does the second electrically conductive path L2.

Moreover, it is preferable that the first via conductor 5a is made larger in cubic volume than the second via conductor 5b. This is because, in the case of connecting the first electrode 3a subjected to a large amount of heat to the larger-volume first electrically conductive path L1, the leading of heat is even more successful by virtue of the first electrically conductive path L1. This makes it possible to dissipate a larger amount of heat emanating from the light-emitting device 3. It is also preferable that the cubic volume of the first electrically conductive path L1 is set to be 4 to 30 times that of the second electrically conductive path L2. If the former is less than 4 times the latter, the heat emanating from the light-emitting device 3 fails to pass through the first electrically conductive path L1 efficiently and is thus inhibited from scattering inside the base body 1 and dissipating from the light-emitting apparatus to the outside satisfactorily. This could lead to poor heat-dissipation capability. On the other hand, if the former is greater than 30 times the latter, it is inevitable that the first electrically conductive path L1 has an unduly large cubic volume, and undergoes significant thermal expansion correspondingly. As a result, a great stress could be concentrated in the interior of the base body 1.

Moreover, each of the via conductors 5a and 5b constituting the first and second electrically conductive paths L1 and L2, respectively, should preferably have a side surface thereof inclined in such a way that the cross-sectional area is gradually increased in the direction of depth of the base body 1. This helps prevent heat from remaining in the region close to the light-emitting device 3 and thus improve the heat-dissipation capability. That is, in the case where the first, second via conductor 5a, 5b is so shaped that a side surface thereof is inclined in the depthwise direction, the area of contact between the base body 1 and the first, second via conductor 5a, 5b is increased. This allows, in that part of the first, second via conductor 5a, 5b which is located away from the light-emitting device 3, heat to be diffused into the base body 1 and to move more smoothly in the direction of depth of the base body 1.

Further, in the case of establishing connection between the first electrically conductive path L1 and the first electrode 3a of the light-emitting device 3 via a first connection pad and establishing connection between the second electrically conductive path L2 and the second electrode 3b of the light-emitting device 3 via a second connection pad, the first connection pad is made larger in area than the second connection pad. Such a connection pad is formed by a known method such as a metallization technique or a plating technique.

Note that it is preferable that each of the connection pad, the first electrically conductive path L1, and the second electrically conductive path L2 has an exposed surface thereof coated with a highly corrosion-resistant metal layer such as a 0.5 μm to 9 μm-thick Ni layer or a 0.5 μm to 5 μm-thick Au layer. This makes it possible to protect the connection pad and the first and second electrically conductive paths L1 and L2 from oxidative corrosion more reliably, as well as to strengthen the connection with the light-emitting device 3 made by using a bonding agent such as solder.

Figure 23:
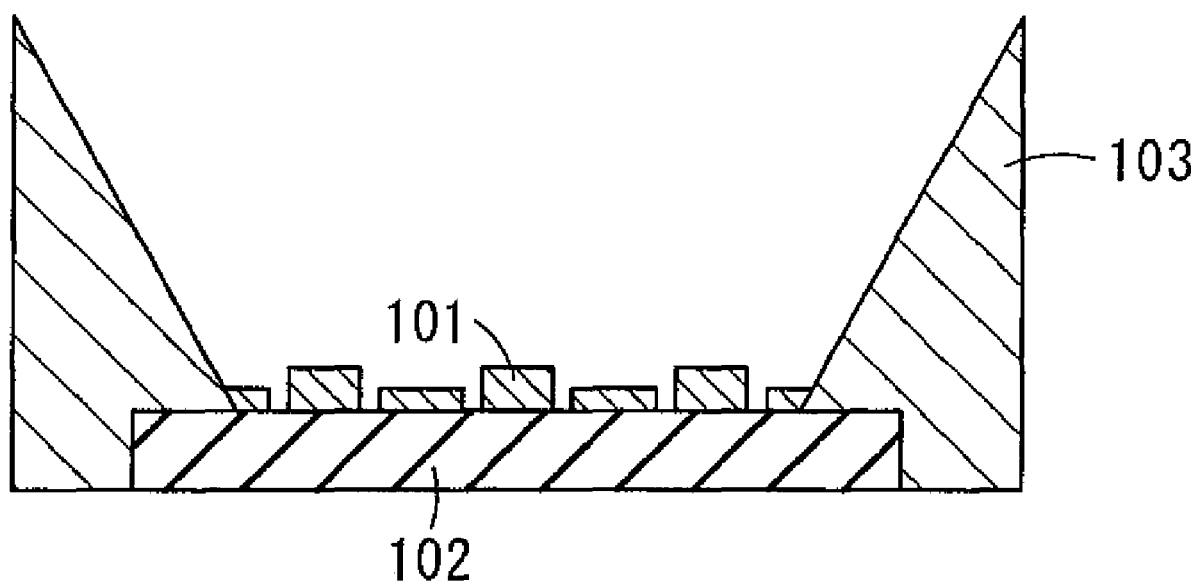
FIG. 23 is a sectional view of the illuminating apparatus depicted in FIG. 22.

Thus constructed, the light-emitting apparatus of this embodiment succeeds in improving the efficiency of dissipating heat transmitted to the first electrode 3a of the light-emitting device 3 and thus in offering enhanced luminous efficiency. That is, in the light-emitting apparatus of this embodiment, the area of joint region between the first electrically conductive path L1 and the first electrode 3a of the light-emitting device 3 is set to be larger than the area of joint region between the second electrically conductive path L2 and the second electrode 3b of the light-emitting device 3. Moreover, as shown in FIG. 23, the first electrode 3a is made larger in area than the second electrode 3b. Accordingly, of a plurality of electrodes formed in the light-emitting device 3, the first electrode 3a which receives transmission of a larger amount of heat than others is allowed to dissipate the heat transmitted thereto to the first electrically conductive path L1, which exhibits lower thermal resistance than does the second electrically conductive path L2, via the joint region between the first electrode 3a and the first electrically conductive path L1 which is larger in area than the joint region between the second electrode 3b and the second electrically conductive path L2. This leads to enhanced heat-dissipation characteristics, as well as to enhanced luminous efficiency.

As shown in FIG. 1A, in the light-emitting apparatus of this embodiment, the area of interface between the first electrically conductive path L1 and the base body 1 is set to be larger than the area of interface between the second electrically conductive path L2 and the base body 1. In this construction, the heat transmitted to the first electrode 3a of the light-emitting device 3 can be dissipated properly to external circuitry via the base body 1 thereby improving the heat-dissipation characteristics.

Thus, in the light-emitting apparatus of this embodiment, since the heat emanating from the light-emitting device 3 is dissipated efficiently to the outside through the first electrically conductive path L1 and the base body 1, it is possible to reduce a stress caused by the difference in thermal expansion coefficient between the base body 1 and the first and second electrically conductive paths L1 and L2, and thereby suppress occurrence of a crack in the base body 1. Accordingly, the light-emitting apparatus of this embodiment is capable of producing output of light suited for illumination or display purposes with enhanced luminous characteristics or illumination characteristics.

Figure 3A:
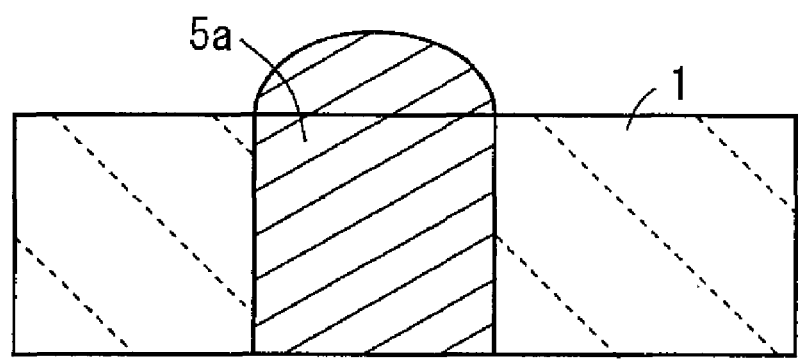
FIG. 3A is an enlarged sectional view showing the principal portion of an example of a via conductor of a light-emitting device housing package according to the invention.

In this embodiment, the light-emitting device mounting substrate may be so designed that one end of the first electrically conductive path L1 to be joined to the first electrode 3a of the light-emitting device 3 has unevenness in level as compared with the surface of the base body 1. For example, in the case where one end of the first electrically conductive path L1 is so shaped as to rise convexly thereby forming a convex surface, the liquid-form bonding agent in a molten state used for mounting the light-emitting device 3 on the base body 1 spreads wetly along one end of the first via conductor 5a and is eventually solidified into meniscus. This enables the light-emitting device 3 to be mounted on the base body 1 with higher bonding strength. Therefore, even if a stress is exerted on the base body 1 and the first and second electrically conductive paths L1 and L2 due to the heat emanating from the light-emitting device 3, the light-emitting device 3 is less prone to coming off from the base body 1. In order to obtain such a convex surface, a part of the upper end face of the first via conductor 5a is so shaped as to protrude upward, or, as shown in FIG. 3A, the entire upper end face of the first via conductor 5a is so shaped as to protrude upward. The convex surface may be either angulated or curved as illustrated in FIG. 3A.

Figure 3B:
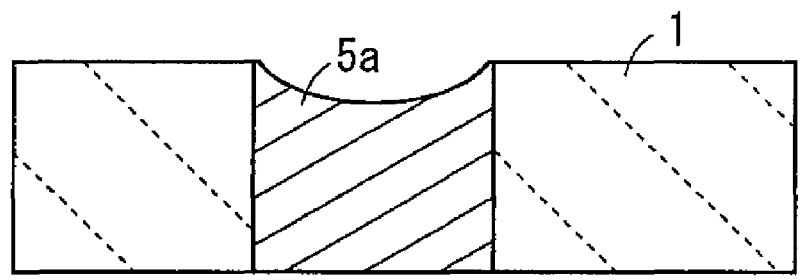
FIG. 3B is an enlarged sectional view showing the principal portion of another example of the via conductor of the light-emitting device housing package according to the invention.

On the other hand, in the case where one end of the first electrically conductive path L1 to be joined to the first electrode 3a of the light-emitting device 3 is so shaped as to sink concavely thereby forming a concave surface, the liquid-form bonding agent in a molten state used for mounting the light-emitting device 3 on the base body 1 penetrates into the concavity formed at the upper end face of the first via conductor 5a. At this time, the bonding agent is increased in volume and thus acts as a cushioning member. This makes it possible to reduce the stress exerted on the base body 1 and the first and second electrically conductive paths L1 and L2 due to the heat emanating from the light-emitting device 3. In order to obtain such a concavity, a part of the upper end face of the first via conductor 5a is so shaped as to cave in, or, as shown in FIG. 3B, the entire upper end face of the first via conductor 5a is so shaped as to cave in. The surface of the concavity may be either angulated or curved as illustrated in FIG. 3B.

In the light-emitting apparatus of this embodiment, the light reflection portion 6 is formed on the base body 1 so as to surround the light-emitting device 3. The light emitted from the light-emitting device 3 is reflected from the light reflection surface 6a and then travels to get out of the light-emitting apparatus. Accordingly, light absorption or transmission is hardly effected by the base body 1, wherefore higher radiation intensity or brightness can be attained.

The light reflection portion 6 having such a light reflection surface 6a can be obtained by performing a cutting operation or a die-molding operation on a high-reflectivity metal material such as Al, Ag, Au, Pt, Ti, Cr, or Cu, or ceramic of white color or the like, or resin of white color or the like. The light reflection surface 6a may be formed by coating the inner peripheral surface of the light reflection portion 6 with a metal thin film made of Al, Ag, or Au by means of plating, vapor deposition, or otherwise. Note that, in the case of forming the light reflection surface 6a with use of a metal material such as Ag or Cu that is susceptible to discoloration caused by oxidation, the light reflection surface 6a should preferably be coated with an inorganic substance such as low-melting-point glass or sol-gel glass that exhibits excellent transmittance in regions ranging from ultra violet light to visible light, or an organic substance such as silicone resin or epoxy resin. This makes it possible to improve the corrosion resistance, the chemical resistance, and the weather resistance of the light reflection surface 6a.

As illustrated in FIG. 1A, in the case where the light reflection portion 6 is bondedly formed on the base body 1, the light reflection portion 6 and the base body 1 are bonded to each other by a bonding agent such as a brazing filler metal or solder, for example, Au—Cu, Pb—Sn, Au—Sn, Au—Si, or Sn—Ag—Cu, or a silicone resin-base or epoxy resin-base adhesive. The use of a bonding agent made of a brazing filler metal or solder is especially desirable from the standpoint of strengthen the connection between the base body 1 and the light reflection portion 6. On the other hand, in the case where the light reflection portion 6 is formed integrally with the base body 1, there is no need to use such a bonding agent as mentioned just above. For example, in the case of using ceramic to form the base body 1 and the light reflection portion 6, a single-piece construction of the base body 1 and the light reflection portion 6 can be obtained by stacking together a ceramic green sheet which is formed into the base body 1 and another ceramic green sheet which is formed into the light reflection portion 6, and then firing the stacked body at one time.

It is preferable that an arithmetic average surface roughness Ra of the light reflection surface 6a is set at or below 4 μm. In this case, light can be reflected therefrom outwardly of the light-emitting apparatus satisfactorily with lesser degree of light loss in the light-emitting device 3. If Ra is greater than 4 μm, it becomes difficult for the light emitted from the light-emitting device 3 to be reflected from the light reflection surface 6a so as to exit out of the light-emitting apparatus on a side of a light-emitting surface thereof. Furthermore, diffuse reflection tends to occur inside the light-emitting apparatus. As a result, the interior of the light-emitting apparatus is liable to undergo significant transmission loss of light, in consequence whereof there results a difficulty in allowing light to exit out of the light-emitting apparatus at a desired radiation angle with high efficiency.

Moreover, if the arithmetic average surface roughness Ra of the light reflection surface 6a is less than 0.004 μm, it becomes difficult to form such a light reflection surface 6a as producing intended effects efficiently with stability. Furthermore, the cost of manufacturing tends to rise. Accordingly, it is preferable that the arithmetic average surface roughness Ra of the light reflection surface 6a is adjusted to fall in a range of from 0.004 μm to 4 μm.

The light reflection surface 6a having an arithmetic average surface roughness Ra falling within the aforementioned range can be formed by a conventionally-known polishing technique such as an electrolytic polishing method, a chemical polishing method, or a cutting polishing method. It is also possible to adopt a transference processing technique which exploits the profile irregularity of a die.

Moreover, FIG. 1B shows another example of the light-emitting apparatus including a refinement in terms of the shape of the light reflection portion. That is, the light reflection portion has a curved sectional profile. In this case, the light emitted from the light-emitting device 3 can be reflected thoroughly and thus allowed to radiate out more evenly with high directivity.

In the light-emitting apparatus of this embodiment, an inside of the light reflection portion 6 formed on the base body 1 is filled with the light-transmittable member 7 so as to cover the light-emitting device 3. For example, such a light-transmittable member 7 is composed of a light-transmitting resin material such as silicone resin, epoxy resin, or urea resin, or a light-transmitting glass material such as low-melting-point glass or sol-gel glass. Silicone resin, in particular, is resistant to quality degradation induced by exposure to light such as ultra violet light emitted from the light-emitting device 3. Accordingly, the use of silicone resin as the light-transmittable member 7 makes it possible to impart excellent sealing reliability to the light-emitting apparatus.

Figure 4A:
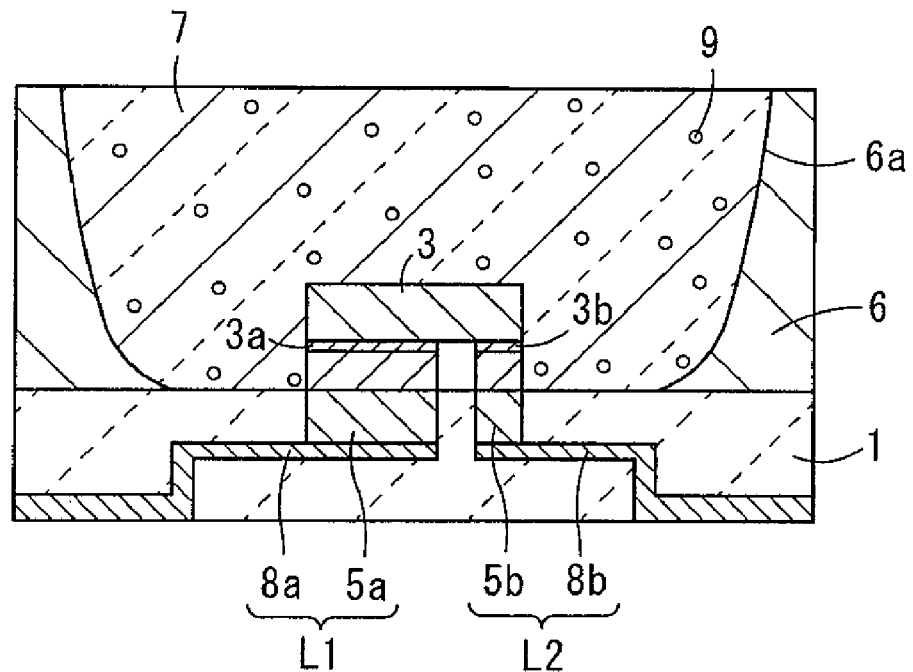
FIGS. 4A and 4B are sectional views showing another example of the light-emitting apparatus implemented by way of the first embodiment of the invention.
Figure 4B:
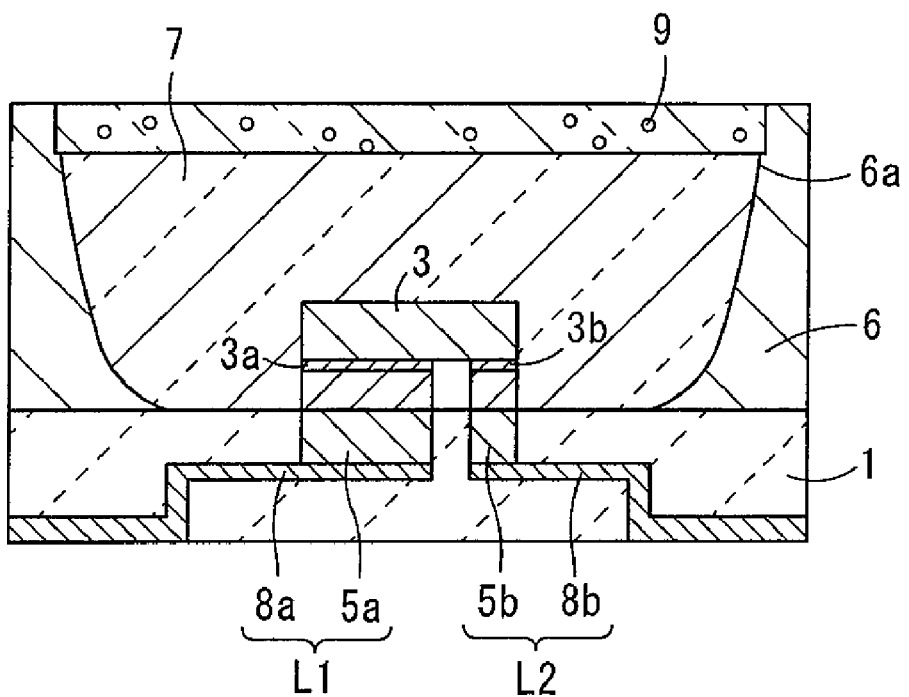

Moreover, as shown in FIGS. 4A and 4B, in the light-emitting apparatus of this embodiment, inside the light reflection portion 6 is formed a wavelength converting member 9 for effecting wavelength conversion for the light emitted from the light-emitting device 3 so as to cover the light-emitting device 3. Such a wavelength converting member 9 is made of a material which gives forth light of different colors such as blue, red, and green through recombination of electrons after being excited by the light emitted from the light-emitting device 3. Specific examples of suitable materials include an alkaline earth aluminate phosphor, an yttrium aluminum garnet-base phosphor activated by at least one kind of substance selected from rear earth elements, and a pigment material.

In the light-emitting apparatus of this embodiment, the heat emanating from the light-emitting device 3 is dissipated to the outside efficiently through the first electrically conductive path L1 and the base body 1. Therefore, since development of a stress can be suppressed, it is possible to reduce variation in the ratio of mixture between the light from the light-emitting device 3 and the light from the wavelength converting member 9 derived from the light-emitting apparatus. That is, if the heat cannot be dissipated satisfactorily through the first electrically conductive path L1, the light-emitting device 3 undergoes a temperature rise, thus causing variation in peak wavelength. In this case, considering the fact that the light conversion efficiency in the wavelength converting member 9 is dependent upon the peak wavelength of the light-emitting device 3, the light-emitting apparatus could fail to emit desired light. In view of the foregoing, according to the light-emitting apparatus of this embodiment, since the area of joint region between the first electrically conductive path L1 and the first electrode 3a of the light-emitting device 3 is set to be larger than the area of joint region between the second electrically conductive path L2 and the second electrode 3b of the light-emitting device 3, it is possible to suppress peak wavelength variation occurring in the light-emitting device 3, and thereby stabilize the light intensity of fluorescence produced by the wavelength converting member 9.

Second Embodiment

Figure 5A:
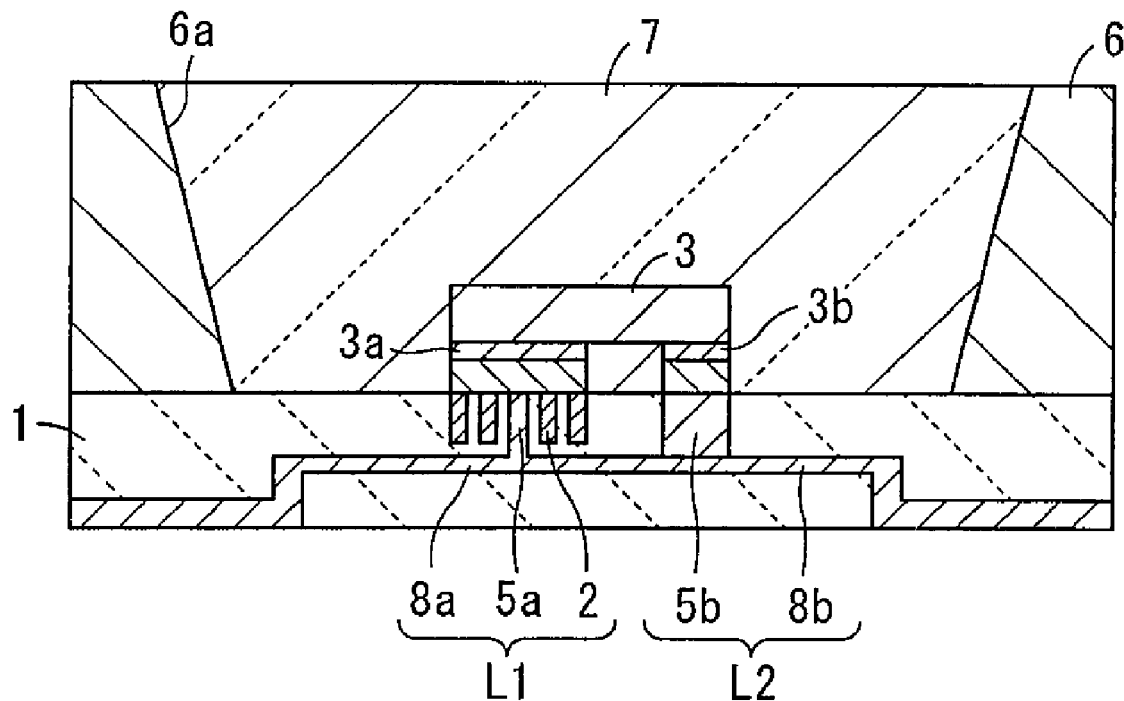
FIGS. 5A and 5B are sectional views showing a light-emitting apparatus in accordance with a second embodiment of the invention.
Figure 5B:
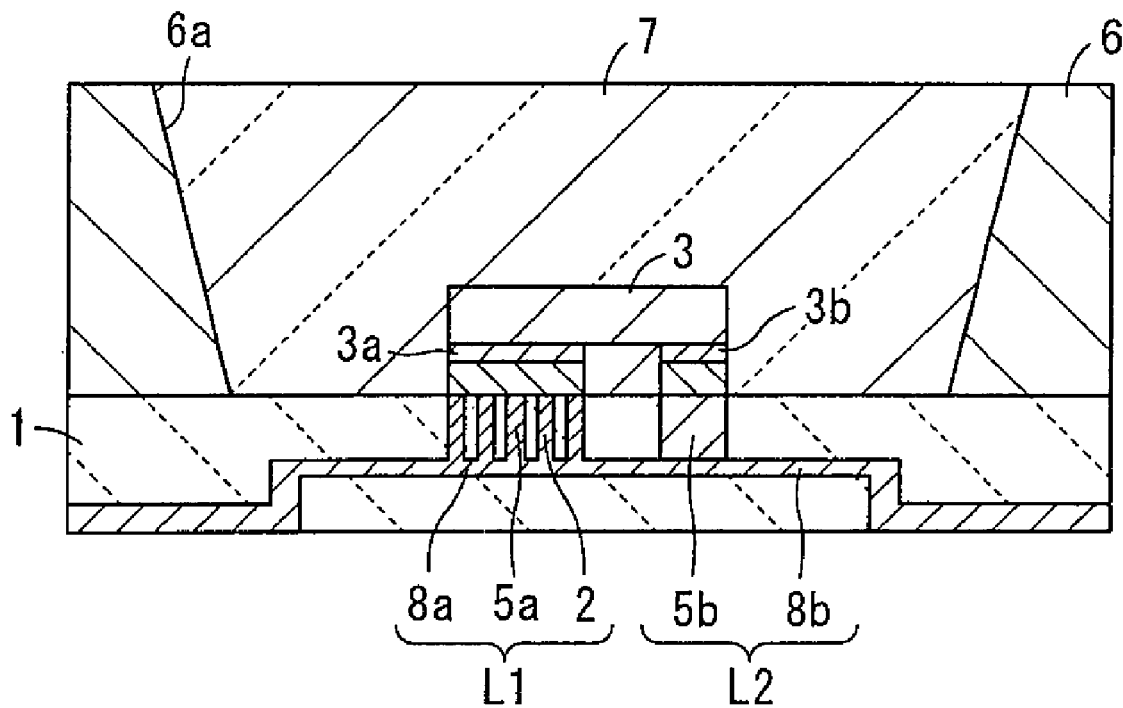
Figure 6:
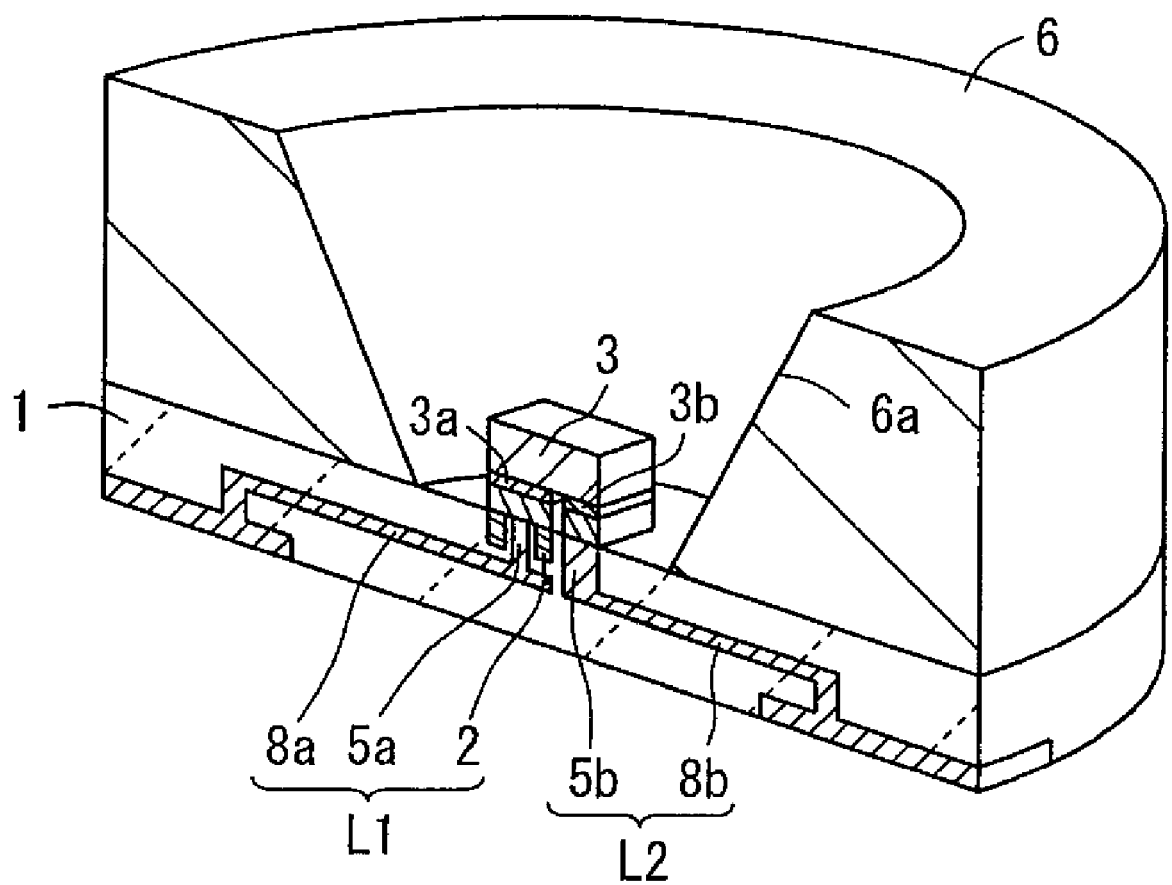
FIG. 6 is a sectional perspective view of the light-emitting apparatus depicted in FIG. 5A.

FIGS. 5A and 5B are sectional views showing a light-emitting device mounting substrate and a light-emitting apparatus incorporating the substrate in accordance with a second embodiment of the invention. FIG. 6 is a sectional perspective view of the construction depicted in FIG. 5A.

As shown in FIG. 5A, in the light-emitting apparatus of the second embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a that are formed in the base body 1. The first electrically conductive path L1 has one end thereof electrically connected to a first electrode 3a of the light-emitting device 3 and the other end thereof led out to a surface of the base body 1. In the construction illustrated in FIG. 5A, one end of each of a plurality of electrical conductors 2 is connected to the first electrode 3a of the light-emitting device 3, and the other end thereof is formed as a free end. Moreover, in the construction illustrated in FIG. 5A, the other end of the first electrically conductive path L1 is led out to the mounting surface, namely the lower surface, of the base body 1.

The electrical conductor 2 such as shown herein is made of a metal material such as W, Mo, Mn, or Cu. The use of a metal material which exhibits high thermal conductivity, such as Cu, makes it possible for the heat emanating from the light-emitting device 3 to be dissipated from the light-emitting apparatus to the outside more efficiently. The electrical conductor 2 may be designed in the shape of column. In the base body 1, the electrical conductor 2 may be so formed as to extend from the region to which is connected the first electrode 3a of the light-emitting device 3 partway to the midportion in the direction of thickness of the base body 1, or may be so formed as to pass all the way through from said region to the lower surface of the base body 1.

The second electrically conductive path L2 is composed of a second via conductor 5b formed by filling a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 5A, the other end of the second electrically conductive path L2 is formed on the mounting surface, namely the lower surface, of the base body 1.

In this embodiment, the first electrically conductive path L1 is made smaller in thermal resistance than the second electrically conductive path L2. Herein, the configuration in which the thermal resistance of the first electrically conductive path L1 is smaller than that of the second electrically conductive path L2 refers to a configuration in which the area of joint region between the first electrically conductive path L1 and the base body 1 is set to be larger than the area of joint region between the second electrically conductive path L2 and the base body 1.

As shown in FIG. 5A, in the light-emitting apparatus of this embodiment, the first electrically conductive path L1 includes a plurality of electrical conductors 2 connected to the first electrode 3a of the light-emitting device 3.

Thus constructed, the light-emitting apparatus of this embodiment succeeds in improving the efficiency of dissipating heat transmitted to the first electrode 3a of the light-emitting device 3 and thus in offering enhanced luminous efficiency. That is, in the light-emitting apparatus of this embodiment, the first electrically conductive path L1 includes a plurality of electrical conductors 2 connected to the first electrode 3a of the light-emitting device 3. In this construction, of a plurality of electrodes formed in the light-emitting device 3, the first electrode 3a which receives transmission of a larger amount of heat than others is allowed to dissipate the heat transmitted thereto from the first electrically conductive path L1, which is lower in thermal resistance than the second electrically conductive path L2, through the surface of the first electrically conductive path L1 which is larger in the area of joint region with the base body 1 than the second electrically conductive path L2. This leads to enhanced heat-dissipation characteristics, as well as to enhanced luminous efficiency. As a result, neither the light-emitting device 3 nor the base body 1 undergoes heat confinement, wherefore development of a stress caused by the difference in thermal expansion coefficient between the light-emitting device 3 and the base body 1 can be suppressed. This helps prevent occurrence of falling-off of the light-emitting device 3 and also protect the base body 1 and the light-emitting device 3 from breakage. As another advantage, by virtue of excellent heat-dissipation characteristics and low thermal resistance, power of higher level can be applied to the light-emitting device 3. Accordingly, the light-emitting apparatus is capable of producing output of light having high luminous intensity suited for illumination or display purposes with stable luminous characteristics and illumination characteristics.

Moreover, as shown in FIG. 5A, of a plurality of electrical conductors 2, at least one of them is connected to the first electrode 3a of the light-emitting device 3 and serves as a part of the first electrically conductive path L1. Thereby, the heat transmitted to the first electrode 3a is directly received by a plurality of electrical conductors 2, and is thereafter dissipated efficiently from the light-emitting apparatus to the outside through the first electrically conductive path L1.

In this construction, the heat transmitted to the first electrode 3a of the light-emitting device 3 can be dissipated efficiently to an external circuit board via the base body 1. Given that a plurality of electrical conductors 2 are formed in the lower part of the base body 1, as seen in FIG. 5A, so that they are not connected to the first electrode 3a, then the heat transmitted to the first electrode 3a cannot be received satisfactorily by a plurality of electrical conductors 2 constituting the first electrically conductive path L1, with the result that the heat dissipation from the base body 1 to the outside could be unsuccessful. Accordingly, with the provision of the electrical conductor 2 connected to the first electrode 3a of the light-emitting device 3 in the first electrically conductive path L1 formed inside the base body 1, most of the heat liberated by the light-emitting device 3 can be dissipated from the light-emitting apparatus to the outside. This leads to enhanced heat-dissipation capability.

Moreover, it is preferable that the total area of joint region between the first electrode 3a of the light-emitting device 3 and each of a plurality of electrical conductors 2 is set to be larger than the total area of joint region between the first electrode 3a of the light-emitting device 3 and the base body 1. In this case, the area of the electrical conductor 2 for heat dissipation can be increased even further, and the heat-dissipation path can be widened correspondingly. Accordingly, a larger amount of heat emanating from the light-emitting device 3 can be scattered over a wider region in the base body 1 and dissipated from the light-emitting apparatus to the outside. This makes it possible to suppress development of a stress caused by the difference in thermal expansion coefficient between the light-emitting device 3 and the base body 1, and thereby prevent occurrence of falling-off of the light-emitting device 3 and also protect the base body 1 and the light-emitting device 3 from breakage.

Note that, if the total area of joint region between the first electrode 3a of the light-emitting device 3 and each of a plurality of electrical conductors 2 is set to be smaller than the total area of joint region between the first electrode 3a of the light-emitting device 3 and the base body 1, the area of the electrical conductor 2 for heat dissipation is decreased. This makes it difficult to diffuse heat over a wider region in the base body 1 through the electrical conductor 2. As a consequence, the heat remains in the upper part of the base body 1, and thus this causes a confined heat-dissipation path, over which the heat emanating from the light-emitting device 3 cannot be dissipated properly. This could lead to poor heat-dissipation capability and thus to development of an undesirable stress.

It is preferable that the total area of joint region between the first electrode 3a of the light-emitting device 3 and each of a plurality of electrical conductors 2 is set to be at least ½ of the total area of joint region between the first electrode 3a of the light-emitting device 3 and the base body 1. This helps improve the heat-dissipation capability of the light-emitting device 3 even further.

Note that, with respect to the midportion of the electrical conductor 2 in cross section, the outer dimension of each of the adjacent electrical conductors 2 is set to be 0.5 to 3 times of the interval between the adjacent electrical conductors 2. In this case, the electrical conductor 2 contributes to enhanced heat-dissipation capability, and also development of a stress in the base body 1 can be prevented effectively. If the former is less than 0.5 times the latter, it is inevitable that the electrical conductor 2 has a smaller cross-sectional area, and thus the effect of improving the heat-dissipation capability could be insufficient. On the other hand, if the former is greater than 3 times the latter, the electrical conductor 2 undergoes significant thermal expansion, and thus the base body 1 is susceptible to a stress.

It is also referable that each of a plurality of electrical conductors 2 is so shaped that a cross-sectional area thereof becomes larger gradually from one end to be joined to the first electrode 3a of the light-emitting device 3 to the other end. This makes it possible to facilitate downward propagation of heat and thereby diffuse the heat into the base body 1 satisfactorily through that a part of the electrical conductor 2 which is away from the light-emitting device 3. Accordingly, the heat can be inhibited from remaining in the region close to the light-emitting device 3, wherefore the heat-dissipation capability can be improved even further.

Next, FIG. 5B shows another example of the light-emitting apparatus including a refinement in terms of connection between the wiring conductor 8a and the electrical conductor 5. In this construction, all of the electrical conductors 2 each have one end thereof connected to the first electrode 3a and the other end thereof connected to the wiring conductor 8a formed inside the base body 1. That is, the opposite ends of each and every electrical conductor 2 are connected to the first electrode 3a and the wiring conductor 8a, respectively. Thereby, most of the heat liberated by the light-emitting device 3 can be transmitted to the electrical conductors 2 and then diffused into the base body 1. Accordingly, the light-emitting device 3 can be prevented from undergoing a temperature rise more effectively. As another advantage, since the electrical resistance between the light-emitting device 3 and an external electrical circuit board can be decreased, even if power of higher level is supplied from the external electrical circuit board to the light-emitting device 3, it never occurs that the wiring conductor 8a, 8b suffers from resistance-induced heat generation. Note that the second embodiment is otherwise similar to the first embodiment in terms of configuration and working.

Third Embodiment

Figure 7A:
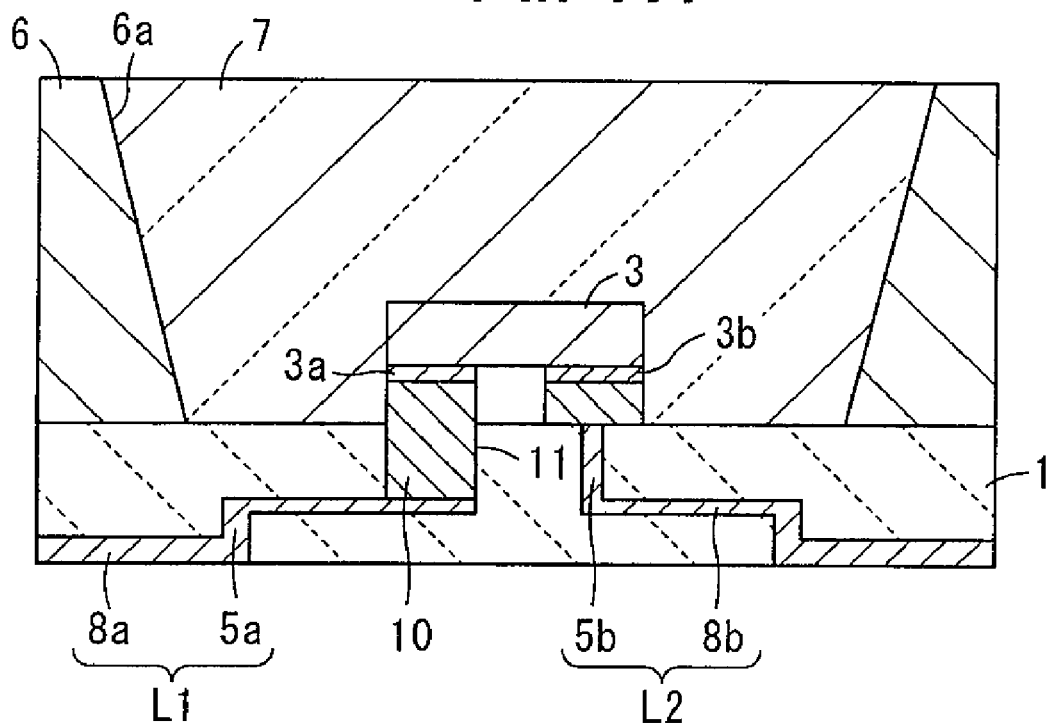
FIGS. 7A and 7B are sectional views showing a light-emitting apparatus in accordance with a third embodiment of the invention.
Figure 7B:
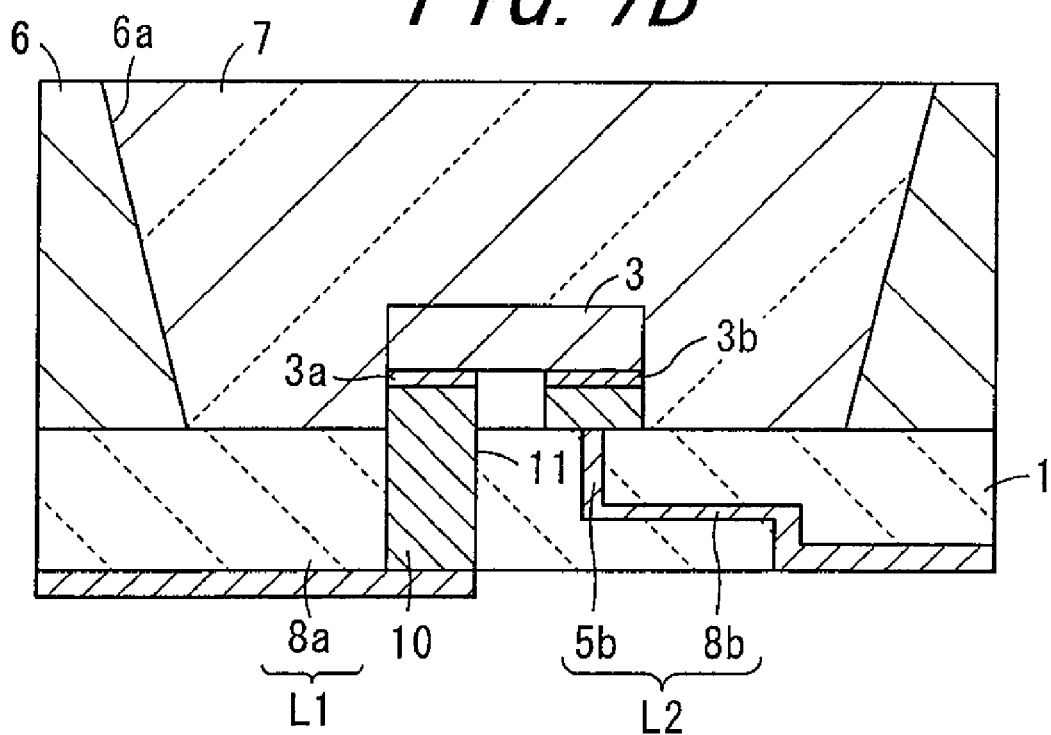
Figure 8:
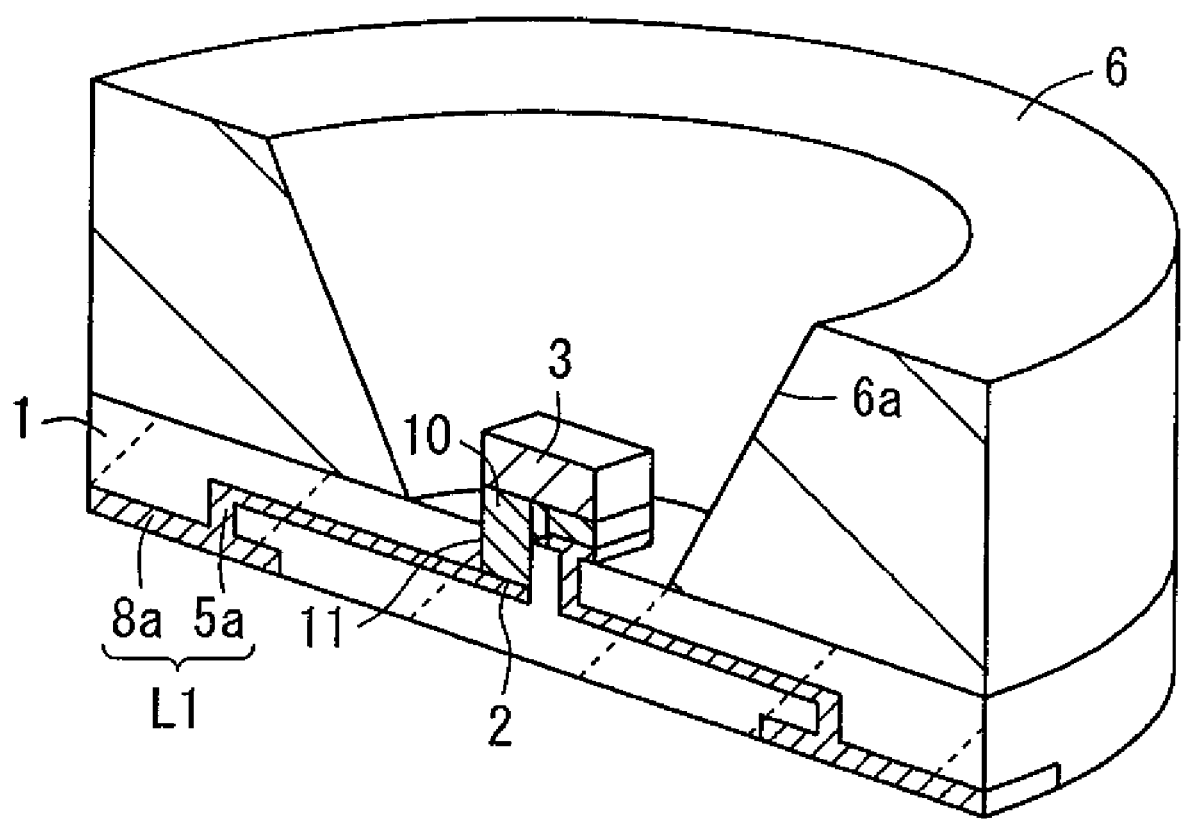
FIG. 8 is a sectional perspective view of the light-emitting depicted in FIG. 7A.

FIGS. 7A and 7B are sectional views showing a light-emitting device mounting substrate and a light-emitting apparatus incorporating the substrate in accordance with a third embodiment of the invention. FIG. 8 is a sectional perspective view of the construction depicted in FIG. 7A.

As shown in FIG. 7A, in the light-emitting apparatus of the third embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a first via conductor 5a formed by filling a via hole with an electrically conductive material and a wiring conductor 8a. The first electrically conductive path L1 has one end thereof electrically connected to a first electrode 3a of the light-emitting device 3 and the other end thereof led out to a surface of the base body 1. In the construction illustrated in FIG. 7A, one end of the first via conductor 5a is electrically connected to the first electrode 3a of the light-emitting device 3, and the other end of the first electrically conductive path L1 is led out to the mounting surface, namely the lower surface, of the base body 1.

The second electrically conductive path L2 is composed of a second via conductor 5b formed by filing a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 7A, the other end of the second electrically conductive path L2 is formed on the mounting surface, namely the lower surface, of the base body 1.

In this embodiment, the first electrically conductive path L1 is made smaller in thermal resistance than the second electrically conductive path L2. Herein, the configuration in which the thermal resistance of the first electrically conductive path L1 is smaller than that of the second electrically conductive path L2 refers to a configuration in which the interfacial area between the mutually-bonded constituent components of the first electrically conductive path L1 is smaller than the interfacial area between the mutually-bonded constituent components of the second electrically conductive path L2, as seen along the route from the first, second electrode 3*a*, 3*b* of the light-emitting device to external circuitry.

In the light-emitting apparatus of this embodiment, as shown in FIG. 7A, a certain portion of the base body 1 has a smaller thickness than others because of creation of a hole 11. A part of the first electrically conductive path L1 is exposedly located in the smaller-thickness portion of the base body 1, namely in the hole 11. By way of a connecting agent 10 penetrating into the hole 11, the led-out portion of the first electrically conductive path L1 and the first electrode 3*a* of the light-emitting device 3 are electrically connected to each other.

For example, the connecting agent 10 is made of a solder material such as Au—Sn or Pb—Sn, or an Ag paste. The hole 11 of the base body 1 is formed by removing a part of the base body 1 by means of polishing, machining, etching, or otherwise. It is also possible to form the hole 11 in advance at the time of stacking together ceramic green sheets, for example, that are formed into the base body 1 through a firing process.

Thus constructed, the light-emitting apparatus of this embodiment succeeds in improving the efficiency of dissipating heat transmitted to the first electrode 3*a* of the light-emitting device 3 and thus in offering enhanced luminous efficiency. That is, the light-emitting apparatus of this embodiment is so designed that the proportion of the base body 1 is reduced in the path over which the heat emanating from the light-emitting device 3 is propagated, and that the connecting agent 10 penetrates into the base body 1 so as to be connected directly to the first electrically conductive path L1. In this construction, of a plurality of electrodes formed in the light-emitting device 3, the first electrode 3*a* which receives transmission of a larger amount of heat than others is allowed to dissipate the heat transmitted thereto to the first electrically conductive path L1 which exhibits lower thermal resistance than does the second electrically conductive path L2. This leads to enhanced heat-dissipation characteristics, as well as to enhanced luminous efficiency.

Moreover, since the connecting agent 10 penetrates into the hole 11 provided in the base body 1, it is possible to attain a higher anchor effect and thereby strengthen the connection between the light-emitting device 3 and the base body 1 even further. As another advantage, since the connecting agent 10 is caused to shrink mainly at a part thereof which penetrates into the hole 11, it is possible to stabilize the state of contraction of the connecting agent 10 regardless of, for example, the surface condition of the electrode of the light-emitting device 3. Accordingly, the base body 1 and the connecting agent 10 can be connected to each other with higher connection strength, and also the light-emitting device 3 is able to reduce degree of unevenness of outputted light.

Moreover, it is preferable that the hole 11 has a slant side surface. This helps increase the area of contact between the base body 1 and the connecting agent 10, a part of which is buried in the hole 11. In this case, the heat emanating from the light-emitting device 3 can be diffused into the base body 1 readily and dissipated from the light-emitting apparatus to the outside efficiently.

It is also preferable that the sum of the cubic volume of the first electrically conductive path L1 connected to the first electrode 3*a* and the cubic volume of the connecting agent 10 for establishing connection between the first electrode 3*a* and the first electrically conductive path L1 is set to be greater than the sum of the cubic volume of the second electrically conductive path L2 connected to the second electrode 3*b* of the light-emitting device 3 and the cubic volume of the connecting agent for establishing connection between the second electrode 3 band the second electrically conductive path L2. In this case, the leading of heat is even more successful by virtue of the connecting agent 10 connected to the first electrode 3*a*. This makes it possible to dissipate a larger amount of heat liberated by the light-emitting device 3.

More specifically, it is preferable that the sum of the cubic volume of the first electrically conductive path L1 connected to the first electrode 3*a* and the cubic volume of the connecting agent 10 for establishing connection between the first electrode 3*a* and the first electrically conductive path L1 is set to be 4 to 30 times as great as the sum of the cubic volume of the second electrically conductive path L2 connected to the second electrode 3*b* of the light-emitting device 3 and the cubic volume of the connecting agent 10 for establishing connection between the second electrode 3*b* and the second electrically conductive path L2. If the former is less than 4 times the latter, the heat emanating from the light-emitting device 3 cannot be transmitted efficiently through the connecting agent 10 for establishing connection between the first electrode 3*a* and the first electrically conductive path L1. Therefore, the heat cannot be diffused into the base body 1 and dissipated from the light-emitting apparatus to the outside satisfactorily. This leads to poor heat-dissipation capability. On the other hand, if the former is greater than 30 times the latter, it is inevitable that the connecting agent 10 for establishing connection between the first electrode 3*a* and the first electrically conductive path L1 has an unduly large cubic volume, and correspondingly undergoes significant thermal expansion. As a consequence, a great stress could be concentrated in the interior of the base body 1.

It is also preferable that the depth of the hole 11 is set to be equal to or larger than the half of the thickness of the base body 1. This makes it possible to achieve a further reduction in the distance from the connecting agent 10 to the lower surface of the base body 1, namely the length of the path over which the heat emanating from the light-emitting device 3 is dissipated, and thereby enhance the heat-dissipation capability even further.

Next, a description will be given below as to an example of methods for manufacturing the light-emitting apparatus according to the present embodiment. For example, in the case of composing the base body 1 of ceramic or the like material, at first, a plurality of green sheets are prepared for use. In order to obtain the hole 11, a through hole is formed in some of the green sheets that are formed into the base body 1. Then, the green sheets are stacked together, and the stacked body is fired at a temperature approximately in a range of from 1500° C. to 1700° C. Whereupon, the base body 1 is formed. Subsequently, the connecting agent 10 is poured into the hole 11 of the base body 1 by means of a dispenser or otherwise, and the light-emitting device 3 is emplaced so as for an electrode thereof to make contact with the connecting agent 10. After that, the entire construction is heated to a temperature approximately in a range of from 250° C. to 350° C. In this way, there is fabricated the light-emitting apparatus in which the first electrode 3a of the light-emitting device 3 and the led-out portion of the first electrically conductive path L1 are electrically connected to each other via the connecting agent 10.

For example, the filling of the hole 11 with the connecting agent 10 may be achieved by burying the connecting agent 10 in the hole 11 and then bringing it into a molten state through application of heat. Alternatively, it is possible to fill the hole 11 with a solder paste or the like material, with the base body 1 kept masked, by means of screen printing. The filling of the hole 11 with the connecting agent 10 is carried out following the completion of firing of the base body 1, and the connecting agent 10 is heated to a temperature lower than the temperature at which the base body 1 is fired. Under this condition, the light-emitting device 3 and the led-out portion of the first electrically conductive path L1 are electrically connected to each other. Accordingly, the hole 11 can be filled with the connecting agent 10 thoroughly without shrinking excessively.

Next, FIG. 7B shows another example of the light-emitting apparatus including a refinement in terms of the shape of the hole 11 formed in the base body 1. That is, the hole 11 is drilled all the way through from the upper surface to the lower surface of the base body 1. In this case, in addition to the method described herein above, the base body 1 may be constructed by a method for arranging two pieces of the base body 1 portions side by side, with a spacing secured there between as the hole 11.

In FIG. 7B, the through hole 11 is filled up with the connecting agent 10, through which the first electrode 3a of the light-emitting device 3 is connected to an external circuit board. That is, no via conductor is provided in this construction. Accordingly, in the path over which the heat emanating from the light-emitting device 3 is propagated, the number of interfaces resulting from connections between different constituent components can be reduced to one; that is, the interface between the connecting agent 10 and the external circuit board alone. As a result, the heat emanating from the light-emitting device 3 can be dissipated satisfactorily.

Moreover, in FIG. 7B, the hole 11 should preferably have a side surface thereof inclined in such a way that the cross-sectional area is gradually increased with approach toward the lower part of the base body 1. In this construction, in contrast to the case where the cross-sectional area of the hole 11 is made uniform, the external circuit board and the connecting agent 10 can be connected to each other in a wider area. This allows the heat emanating from the light-emitting device 3 to be dissipated from the light-emitting apparatus to the outside more readily, wherefore the heat dissipation can be achieved more efficiently. Note that the third embodiment is otherwise similar to the first embodiment in terms of configuration and working.

Fourth Embodiment

Figure 9:
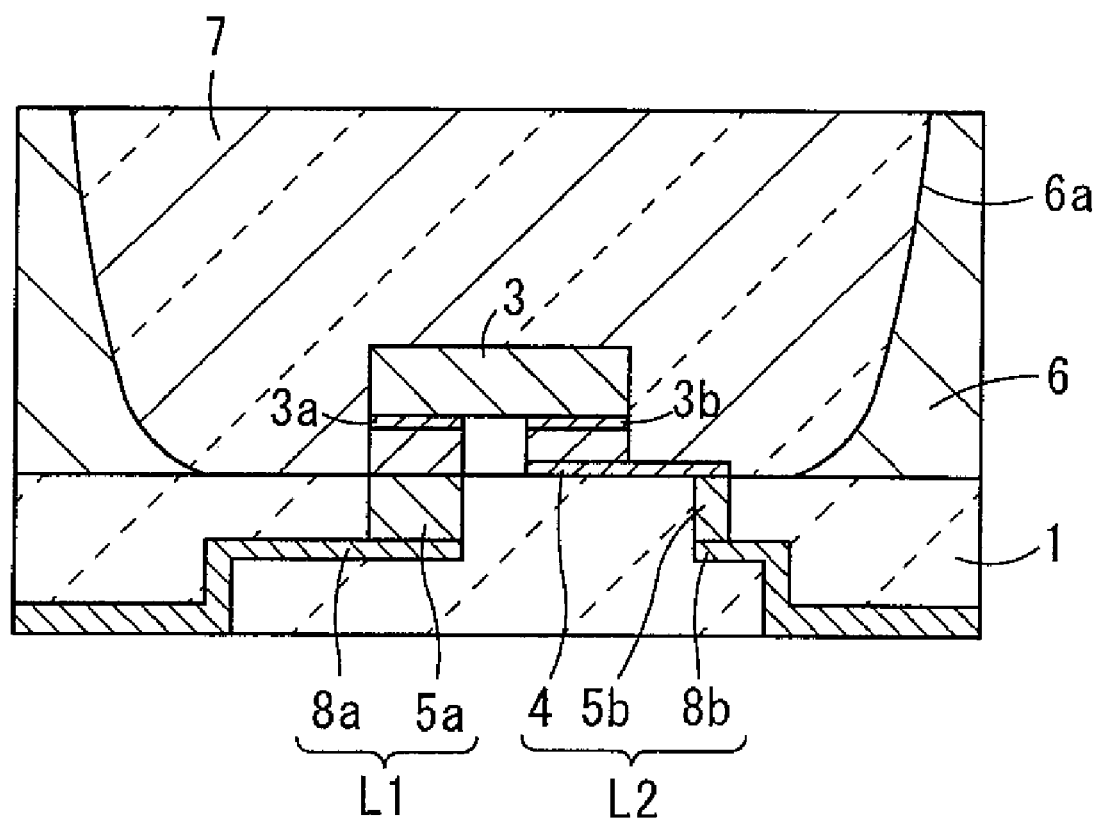
FIG. 9 is a sectional view showing a light-emitting apparatus in accordance with a fourth embodiment of the invention.
Figure 10A:
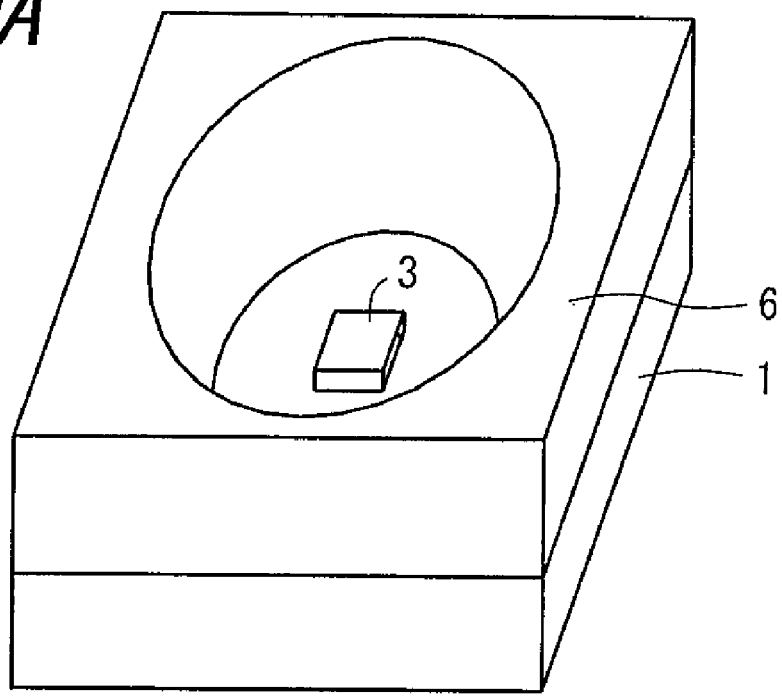
FIG. 10A is a perspective view of the light-emitting apparatus depicted in FIG. 9.
Figure 10B:
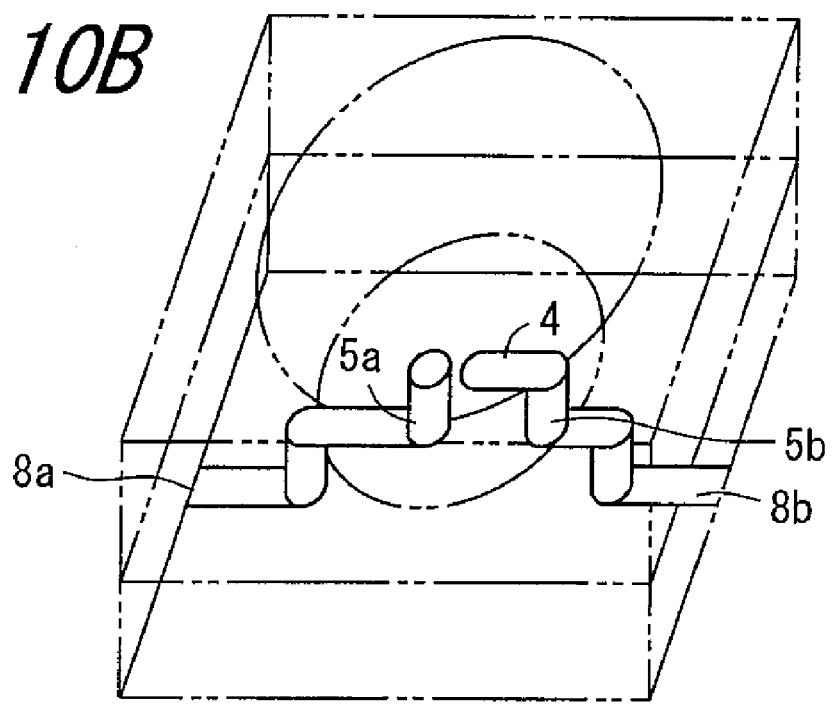
FIG. 10B is a perspective transparent view showing the configuration of the first and the second electrically conductive path of the light-emitting apparatus depicted in FIG. 9.

FIG. 9 is a sectional view showing a light-emitting device mounting substrate and a light-emitting apparatus incorporating the substrate in accordance with a fourth embodiment of the invention. FIG. 10A is a perspective view of the light-emitting apparatus depicted in FIG. 9. FIG. 10B is a perspective transparent view showing the configuration of a first and a second electrically conductive path of the light-emitting apparatus depicted in FIG. 9.

As shown in FIG. 9, in the light-emitting apparatus of the fourth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a first via conductor 5a and a wiring conductor 8a. The first via conductor 5a is formed by filling a via hole provided in the base body 1 with an electrically conductive material. The first electrically conductive path L1 has one end thereof electrically connected to a first electrode 3a of the light-emitting device 3 and the other end thereof led out to a surface of the base body 1. In the construction illustrated in FIG. 9, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 9, the other end of the second electrically conductive path L2 is formed on the mounting surface, namely the lower surface, of the base body 1.

In this embodiment, the first electrically conductive path L1 is made smaller in thermal resistance than the second electrically conductive path L2. Herein, the configuration in which the thermal resistance of the first electrically conductive path L1 is smaller than that of the second electrically conductive path L2 refers to a configuration in which the first electrically conductive path L1 is made smaller in the distance from the electrode of the light-emitting device to the external circuit board than the second electrically conductive path L2.

In the light-emitting apparatus of this embodiment, as shown in FIG. 9, the first electrode 3a of the light-emitting device 3 is continuous with the first electrically conductive path L1 arranged immediately below the first electrode 3a, and the second electrode 3b is electrically connected, via the lead wiring line 4 formed on the upper surface of the base body 1, to the second electrically conductive path L2 formed outwardly of the region immediately below the second electrode 3b.

Thus constructed, the light-emitting apparatus of this embodiment succeeds in improving the efficiency of dissipating heat transmitted to the first electrode 3a of the light-emitting device 3 and thus in offering enhanced luminous efficiency. That is, the light-emitting apparatus of this embodiment is so designed that the distance between the first and second electrically conductive paths L1 and L2 on a common plane is longer than the distance between the first and second electrodes 3a and 3b of the light-emitting device 3 that are bonded to the base body 1. In this construction, of a plurality of electrodes formed in the light-emitting device 3, the first electrode 3a which receives transmission of a larger amount of heat than others is allowed to dissipate the heat transmitted thereto from the first electrically conductive path L1, which exhibits lower thermal resistance than does the second electrically conductive path L2, through the first electrically conductive path L1 which is made smaller in length than the second electrically conductive path L2 having the lead wiring line 4. This leads to enhanced heat-dissipation characteristics, as well as to enhanced luminous efficiency.

Moreover, in this construction, in contrast to the case where both of the first and second electrically conductive paths L1 and L2 are formed immediately below the light-emitting device 3, a longer distance can be secured between the first and second via conductors. This makes it possible to alleviate the stress concentrated in the interior of the base body 1 due to the difference in thermal expansion coefficient between the base body 1 and the first and second electrically conductive paths L1 and L2, and thereby suppress occurrence of a crack.

So long as the first and second electrically conductive paths L1 and L2 are each exposed at the surface of the base body 1, a connection pad may additionally be formed on exposed surfaces thereof. Note that the fourth embodiment is otherwise similar to the first embodiment in terms of configuration and working.

Fifth Embodiment

Figure 11:
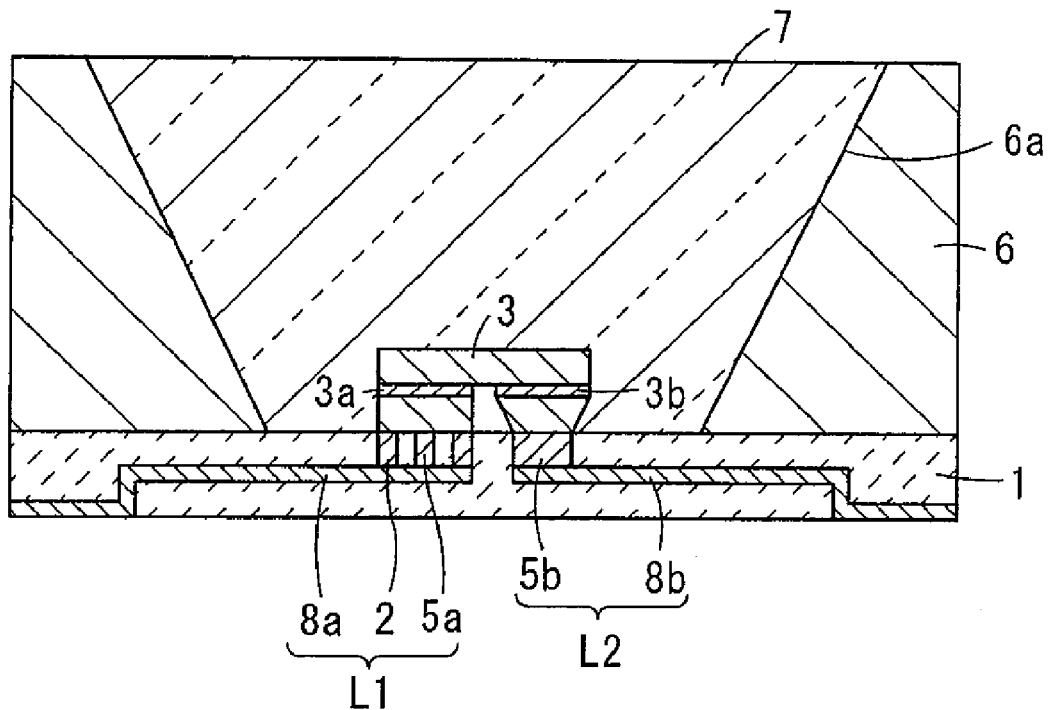
FIG. 11 is a sectional view showing a light-emitting apparatus in accordance with a fifth embodiment of the invention.

FIG. 11 is a sectional view showing a light-emitting device mounting substrate and a light-emitting apparatus incorporating the substrate in accordance with a fifth embodiment of the invention.

As shown in FIG. 11 in the light-emitting apparatus of the fifth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a. The first electrically conductive path L1 has one end electrically thereof connected to a first electrode 3a of the light-emitting device 3 and the other end thereof led out to a surface of the base body 1. In the construction illustrated in FIG. 11, the other end of the first electrically conductive path L1 is led out to the mounting surface, namely the lower surface, of the base body 1.

The second electrically conductive path L2 is composed of a second via conductor 5b formed by filling a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 11, the other end of the second electrically conductive path L2 is formed on the mounting surface, namely the lower surface, of the base body 1.

As shown in FIG. 11, the light-emitting apparatus of this embodiment is so designed that the area of joint region between the first electrically conductive path L1 having a plurality of electrical conductors 2 and the first electrode 3a of the light-emitting device 3 is larger than the area of joint region between the second electrically conductive path L2 and the second electrode 3b of the light-emitting device 3.

Thus constructed, the light-emitting apparatus of this embodiment succeeds in improving the efficiency of dissipating heat transmitted to the first electrode 3a of the light-emitting device 3 and thus in offering enhanced luminous efficiency. Note that the fifth embodiment is otherwise similar to the first embodiment in terms of configuration and working.

Sixth Embodiment

Figure 12:
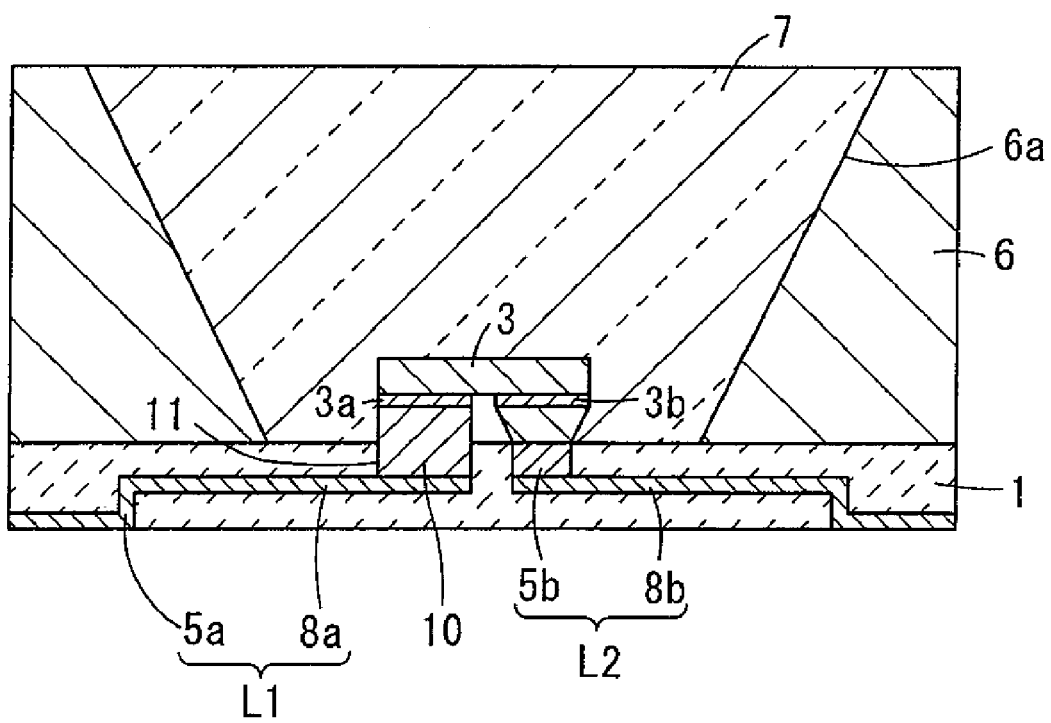
FIG. 12 is a sectional view showing a light-emitting apparatus in accordance with a sixth embodiment of the invention.

FIG. 12 is a sectional view showing a light-emitting device mounting substrate and a light-emitting apparatus incorporating the substrate in accordance with a sixth embodiment of the invention.

As shown in FIG. 12, in the light-emitting apparatus of the sixth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a first via conductor 5a formed by filling a via hole with an electrically conductive material and a wiring conductor 8a. The first electrically conductive path L1 has one end thereof electrically connected to a first electrode 3a of the light-emitting device 3 and the other end thereof led out to a surface of the base body 1. In the construction illustrated in FIG. 12, the other end of the first electrically conductive path L1 is led out to the mounting surface, namely the lower surface, of the base body 1.

The second electrically conductive path L2 is composed of a second via conductor 5b formed by filling a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 12, the other end of the second electrically conductive path L2 is formed on the mounting surface, namely the lower surface, of the base body 1.

As shown in FIG. 12, in the light-emitting apparatus of this embodiment, a certain portion of the base body 1 has a smaller thickness than others because of creation of a hole 11. A part of the first electrically conductive path L1 is exposedly located in the smaller-thickness portion of the base body 1, namely in the hole 11. Moreover, a connecting agent 10 is provided, a part of which penetrates into the hole 11. The area of joint region between the connecting agent 10 and the first electrode 3a of the light-emitting device 3 is set to be larger than the area of joint region between the second electrically conductive path L2 and the second electrode 3b of the light-emitting device 3.

In the light-emitting apparatus of this embodiment, most of the heat liberated by the light-emitting device 3 is diffused, through the first electrically conductive path L1 which is made smaller in thermal resistance than the second electrically conductive path L2, into the base body 1 having a smaller thickness, and immediately afterward the heat is dissipated to an external circuit board. Thus constructed, the light-emitting apparatus of this embodiment succeeds in improving the efficiency of dissipating heat transmitted to the first electrode 3a of the light-emitting device 3 and thus in offering enhanced luminous efficiency. Note that the sixth embodiment is otherwise similar to the first embodiment in terms of configuration and working.

Seventh Embodiment

Figure 13:
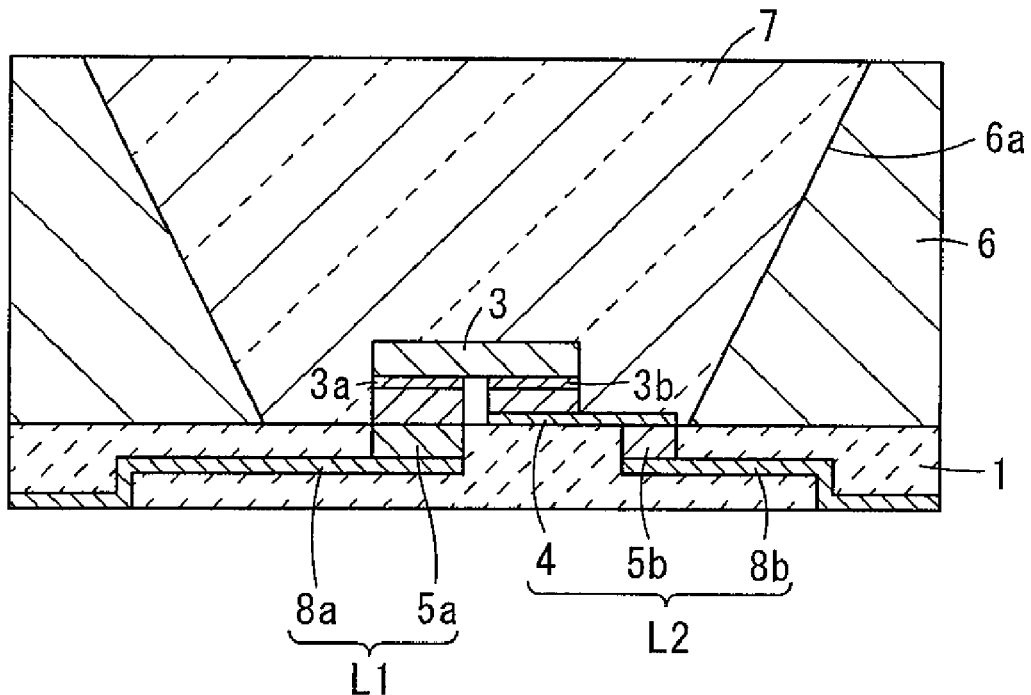
FIG. 13 is a sectional view showing a light-emitting apparatus in accordance with a seventh embodiment of the invention.

FIG. 13 is a sectional view showing a light-emitting device mounting substrate and a light-emitting apparatus incorporating the substrate in accordance with a seventh embodiment of the invention.

As shown in FIG. 13, in the light-emitting apparatus of the seventh embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a lead wiring line 4, a first via conductor 5a formed by filling a via hole with an electrically conductive material, and a wiring conductor 8a. The first electrically conductive path L1 has one end thereof electrically connected to a first electrode 3a of the light-emitting device 3 and the other end thereof led out to a surface of the base body 1. In the construction illustrated in FIG. 13, the other end of the first electrically conductive path L1 is led out to the mounting surface, namely the lower surface, of the base body 1.

The second electrically conductive path L2 is composed of a second via conductor 5b formed by filling a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 13, the other end of the second electrically conductive path L2 is formed on the mounting surface, namely the lower surface, of the base body 1.

In the light-emitting apparatus of this embodiment, as shown in FIG. 13, the area of joint region between the first electrically conductive path L1 and the first electrode 3a of the light-emitting device 3 is set to be larger than the area of joint region between the second electrically conductive path L2 and the second electrode 3b of the light-emitting device 3. Moreover, the distance between the first and second electrically conductive paths L1 and L2 on a common plane is set to be longer than the distance between the first and second electrodes 3a and 3b of the light-emitting device 3 that are bonded to the base body 1.

In the light-emitting apparatus of this embodiment thus constructed, the heat transmitted to the first electrode 3a of the light-emitting device 3 can be dissipated efficiently from the base body 1 and the light-emitting apparatus to the outside through the first electrically conductive path L1. Accordingly, the heat can be inhibited from remaining in the region between the base body 1 and the first and second electrically conductive paths L1 and L2, wherefore development of a stress due to the difference in thermal expansion coefficient there between can be suppressed successfully.

Moreover, in the light-emitting apparatus of this embodiment, the second electrically conductive path L2 is located outwardly of the light-emitting device 3, and the area of joint region between the second electrically conductive path L2 and the second electrode 3b is set to be smaller than the area of joint region between the first electrically conductive path L1 and the first electrode 3a. Accordingly, the area of that part of the second electrically conductive path L2 which is led out to the surface of the base body 1 can be set at as small a value as possible, wherefore the stress developed through the transmission of heat to the base body 1 can be reduced even further. Note that the seventh embodiment is otherwise similar to the first embodiment in terms of configuration and working.

Eighth Embodiment

Figure 14:
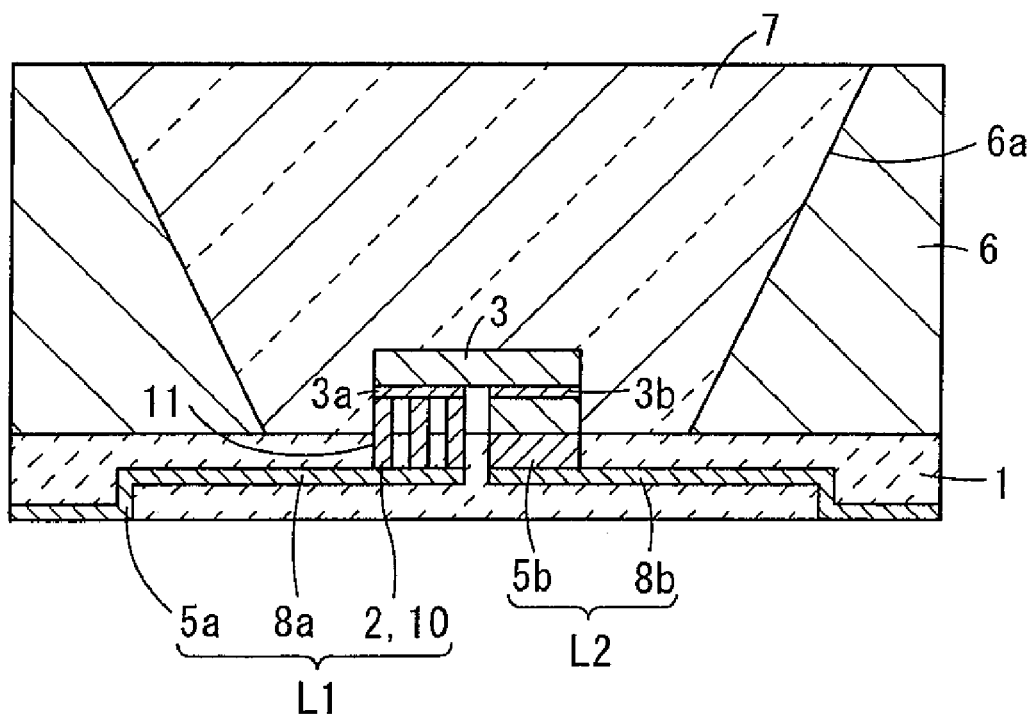
FIG. 14 is a sectional view showing a light-emitting apparatus in accordance with a eighth embodiment of the invention.

FIG. 14 is a sectional view showing a light-emitting device mounting substrate and a light-emitting apparatus incorporating the substrate in accordance with an eighth embodiment of the invention.

As shown in FIG. 14, in the light-emitting apparatus of the eighth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a that are formed in the base body 1. The first electrically conductive path L1 has one end thereof electrically connected to a first electrode 3a of the light-emitting device 3 and the other end thereof led out to a surface of the base body 1. In the construction illustrated in FIG. 14, one end of each of a plurality of electrical conductors 2 is electrically connected to the first electrode 3a of the light-emitting device 3, and the other end thereof is connected to the wiring conductor 8a. Moreover, in the construction illustrated in FIG. 14, the other end of the first electrically conductive path L1 is led out to the mounting surface, namely the lower surface, of the base body 1.

The second electrically conductive path L2 is composed of a second via conductor 5b formed by filling a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 14, the other end of the second electrically conductive path L2 is formed on the mounting surface, namely the lower surface, of the base body 1.

As shown in FIG. 14, in the light-emitting apparatus of this embodiment, certain portions of the base body 1 have a smaller thickness than others because of creation of a plurality of holes 11. A part of the electrical conductor 2 constituting the first electrically conductive path L1 is exposedly located in the smaller-thickness portion of the base body 1, namely in each of the holes 11. Note that a connecting agent 10 portion contained inside the hole 11 acts as the electrical conductor 2.

That is, in the light-emitting apparatus of this embodiment, a part of the connecting agent 10 penetrates into each of a plurality of holes 11 so as to establish connection with the first electrode 3a of the light-emitting device 3 without creating the risk of a short-circuit. Accordingly, most of the heat liberated by the light-emitting device 3 is diffused, through the first electrically conductive path L1 composed of a plurality of electrical conductors 2, into the base body 1 having a smaller thickness, and immediately afterward the heat is dissipated to an external circuit board. As a result, neither the light-emitting device 3 nor the base body 1 undergoes heat confinement, wherefore development of a stress caused by the difference in thermal expansion coefficient between the light-emitting device 3 and the base body 1 can be suppressed. This helps prevent occurrence of falling-off of the light-emitting device 3 and also protect the base body 1 and the light-emitting device 3 from breakage. Note that the eighth embodiment is otherwise similar to the first embodiment in terms of configuration and working.

Ninth Embodiment

Figure 15:
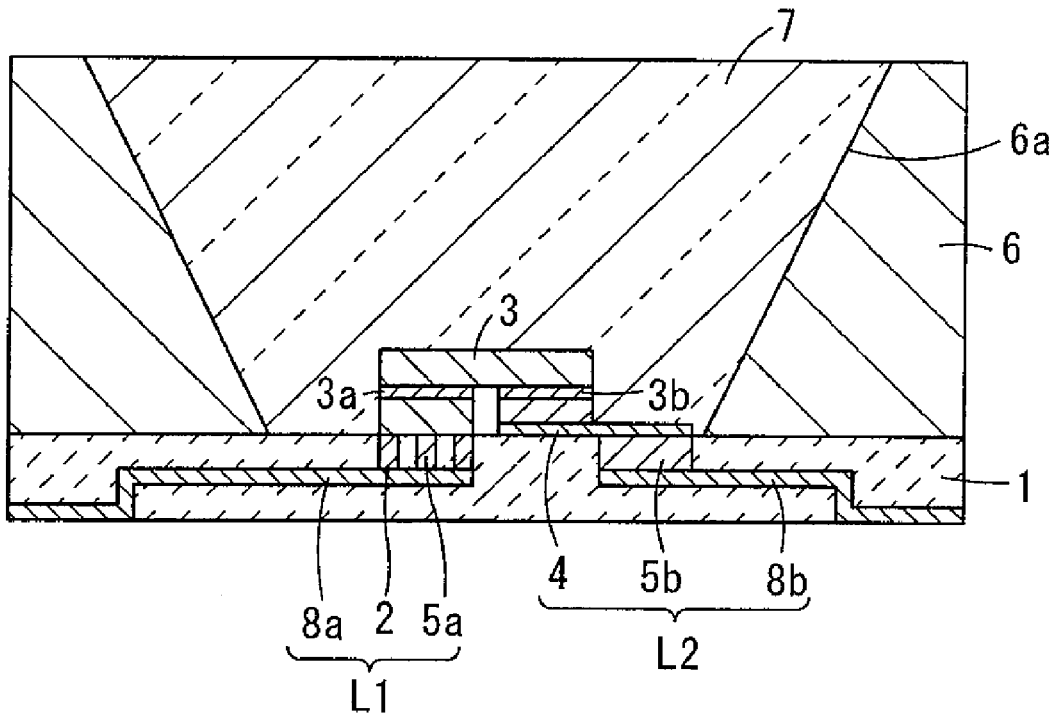
FIG. 15 is a sectional view showing a light-emitting apparatus in accordance with a ninth embodiment of the invention.

FIG. 15 is a sectional view showing a light-emitting device mounting substrate and a light-emitting apparatus incorporating the substrate in accordance with a ninth embodiment of the invention.

As shown in FIG. 15, in the light-emitting apparatus of the ninth embodiment, a light-emitting device 3 is mounted inside an opening formed in a light-emitting device housing package.

Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a. The first electrically conductive path L1 has one end thereof electrically connected to a first electrode 3a of the light-emitting device 3 and the other end thereof led out to a surface of the base body 1. In the construction illustrated in FIG. 15, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 15, the other end of the second electrically conductive path L2 is formed on the mounting surface, namely the lower surface, of the base body 1.

As shown in FIG. 15, in the light-emitting apparatus of this embodiment, the first electrically conductive path L1 includes a plurality of electrical conductors 2 that are joined to the first electrode 3a of the light-emitting device 3. Moreover, the distance between the first and second electrically conductive paths L1 and L2 on a common plane is set to be longer than the distance between the first and second electrodes 3a and 3b of the light-emitting device 3 that are bonded to the base body 1.

That is, in the light-emitting apparatus of this embodiment, the heat transmitted to the first electrode 3a of the light-emitting device 3 is dissipated from the base body 1 and the light-emitting apparatus to the outside through the first electrically conductive path L1 in which the area of heat-dissipation surface is increased by the provision of a plurality of electrical conductors 2. This leads to enhanced heat-dissipation capability. As another advantage, since a sufficient distance is secured between the first and second electrically conductive paths L1 and L2, it is possible to prevent the heat from remaining in the region between the base body 1 and the first and second electrically conductive paths L1 and L2, wherefore development of a stress due to the difference in thermal expansion coefficient there between can be suppressed successfully. Note that the ninth embodiment is otherwise similar to the first embodiment in terms of configuration and working.

Tenth Embodiment

Figure 16:
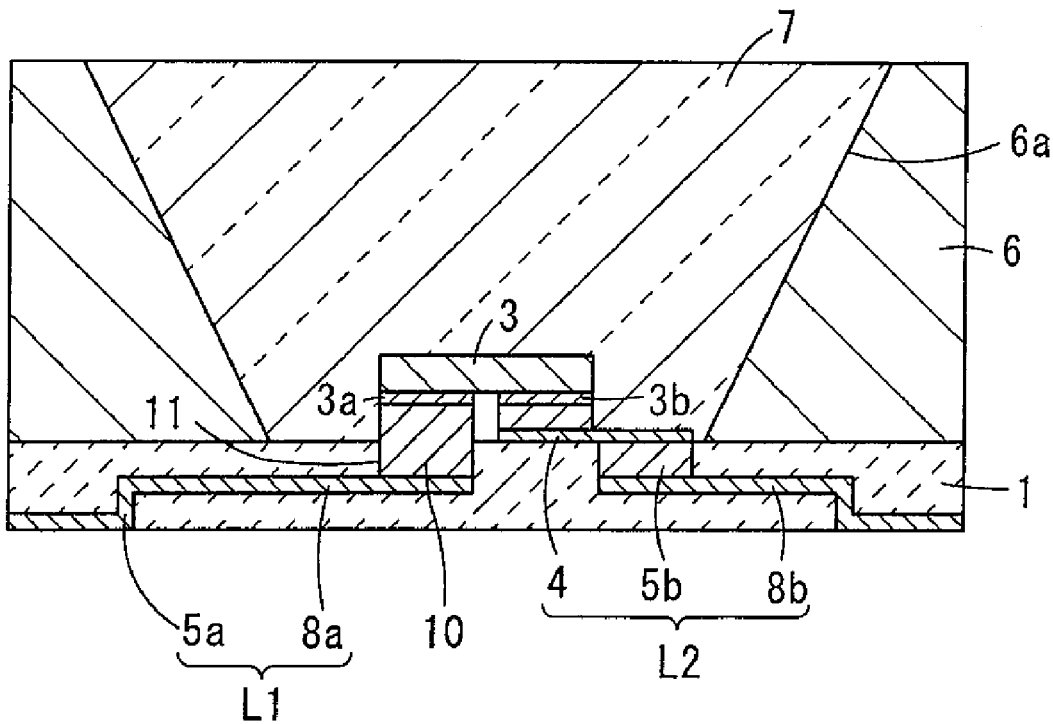
FIG. 16 is a sectional view showing a light-emitting apparatus in accordance with a tenth embodiment of the invention.

FIG. 16 is a sectional view showing a light-emitting device mounting substrate and a light-emitting apparatus incorporating the substrate in accordance with a tenth embodiment of the invention.

As shown in FIG. 16, in the light-emitting apparatus of the tenth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a first via conductor 5a formed by filling a via hole with an electrically conductive material and a wiring conductor 8a. The first electrically conductive path L1 has one end thereof electrically connected to a first electrode 3a of the light-emitting device 3 and the other end thereof led out to a surface of the base body 1. In the construction illustrated in FIG. 16, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 16, the other end of the second electrically conductive path L2 is formed on the mounting surface, namely the lower surface, of the base body 1.

As shown in FIG. 16, in the light-emitting apparatus of this embodiment, certain portions of the base body 1 have a smaller thickness than others because of creation of a plurality of holes 11. A part of the electrical conductor 2 constituting the first electrically conductive path L1 is exposedly located in the smaller-thickness portion of the base body 1, namely in each of the holes 11. Moreover, the distance between the first and second electrically conductive paths L1 and L2 on a common plane is set to be longer than the distance between the first and second electrodes 3a and 3b of the light-emitting device 3 that are bonded to the base body 1. Further, a connecting agent 10 is provided, a part of which penetrates into the hole 11, so as to establish electrical connection between the first electrode 3a of the light-emitting device 3 and that part of the first electrically conductive path L1 which is led out into the hole 11.

In this construction, heat can be dissipated satisfactorily from the first electrically conductive path to a circuit board disposed externally of the light-emitting apparatus. Moreover, the heat can be inhibited from remaining in the region between the base body 1 and the first and second electrically conductive paths L1 and L2, wherefore development of a stress due to the difference in thermal expansion coefficient there between can be suppressed successfully Note that the tenth embodiment is otherwise similar to the first embodiment in terms of configuration and working.

Eleventh Embodiment

Figure 17:
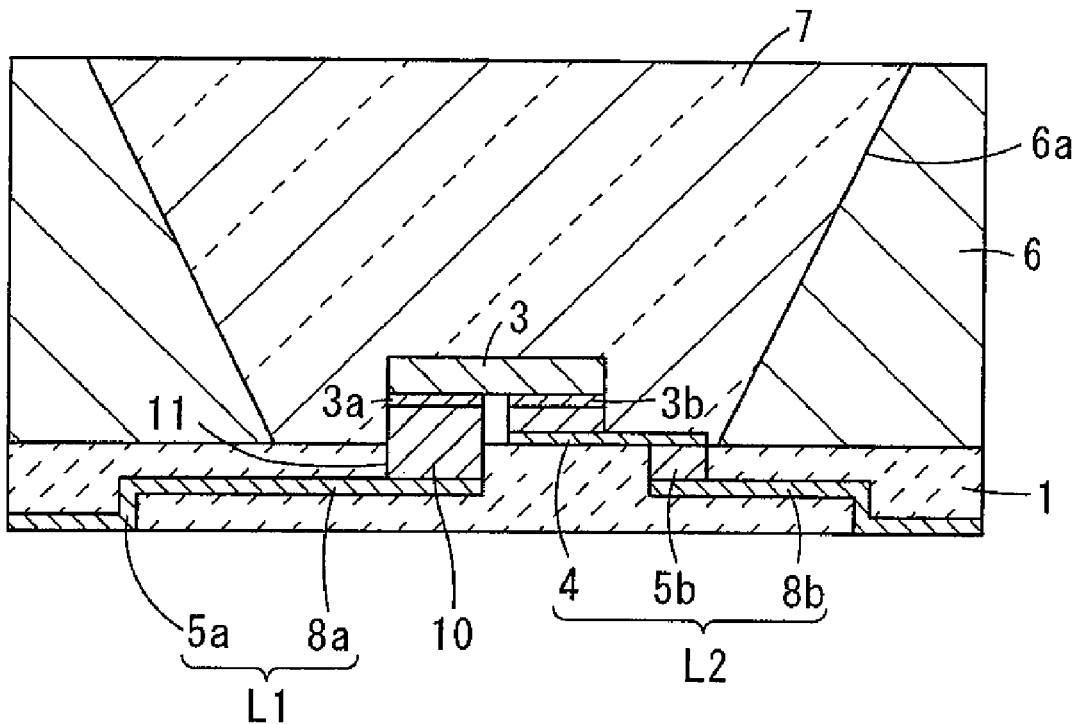
FIG. 17 is a sectional view showing a light-emitting apparatus in accordance with an eleventh embodiment of the invention.

FIG. 17 is a sectional view showing a light-emitting device mounting substrate and a light-emitting apparatus incorporating the substrate in accordance with an eleventh embodiment of the invention.

As shown in FIG. 17, in the light-emitting apparatus of the eleventh embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a first via conductor 5a formed by filling a via hole with an electrically conductive material and a wiring conductor 8a. The first electrically conductive path L1 has one end thereof electrically connected to a first electrode 3a of the light-emitting device 3 and the other end thereof led out to a surface of the base body 1. In the construction illustrated in FIG. 17, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 17, the other end of the second electrically conductive path L2 is formed on the mounting surface, namely the lower surface, of the base body 1.

As shown in FIG. 17, in the light-emitting apparatus of this embodiment, a certain portion of the base body 1 has a smaller thickness than others because of creation of a hole 11. A part of the first electrically conductive path L1 is exposedly located in the smaller-thickness portion of the base body 1, namely in the hole 11. The area of joint region between the first electrically conductive path L1 and the first electrode 3a of the light-emitting device 3 is set to be smaller than the area of joint region between the second electrically conductive path L2 and the second electrode 3b of the light-emitting device 3. Moreover, the distance between the first and second electrically conductive paths L1 and L2 on a common plane is set to be longer than the distance between the first and second electrodes 3a and 3b of the light-emitting device 3 that are bonded to the base body 1.

In this construction, heat can be dissipated satisfactorily from the first electrically conductive path to a circuit board disposed externally of the light-emitting apparatus. Moreover, the heat can be inhibited from remaining in the region between the base body 1 and the first and second electrically conductive paths L1 and L2, wherefore development of a stress due to the difference in thermal expansion coefficient there between can be suppressed successfully. Note that the eleventh embodiment is otherwise similar to the first embodiment in terms of configuration and working.

Twelfth Embodiment

Figure 18:
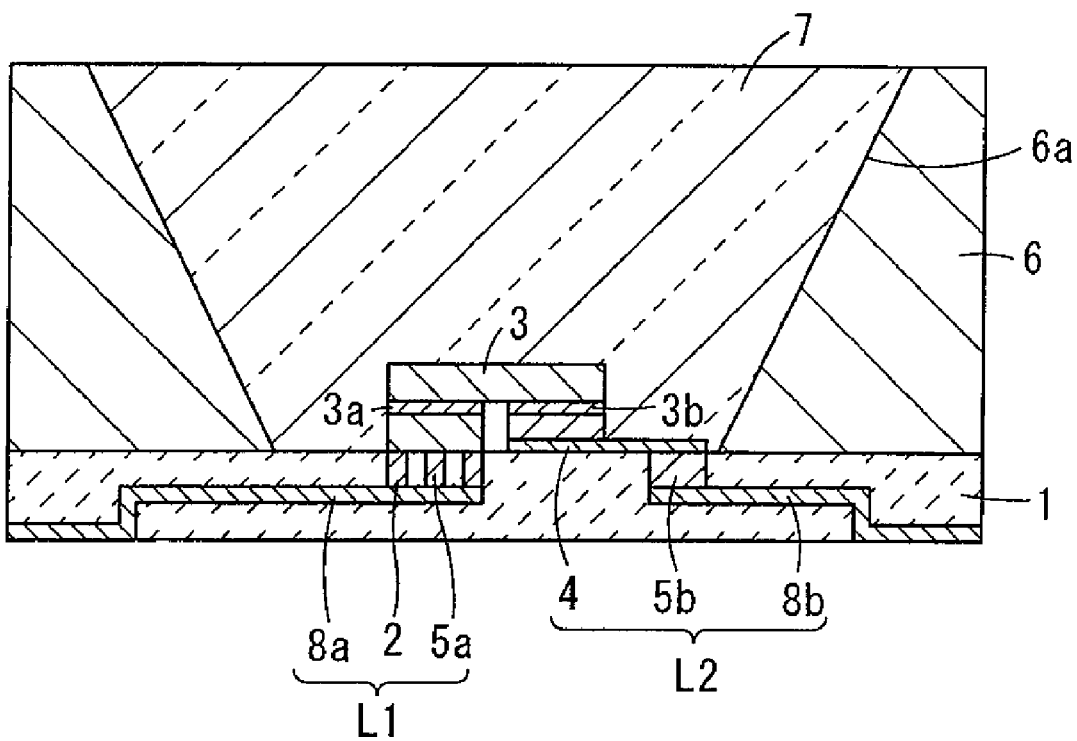
FIG. 18 is a sectional view showing a light-emitting apparatus in accordance with a twelfth embodiment of the invention.

FIG. 18 is a sectional view showing a light-emitting device mounting substrate and a light-emitting apparatus incorporating the substrate in accordance with a twelfth embodiment of the invention.

As shown in FIG. 18, in the light-emitting apparatus of the twelfth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a. The first electrically conductive path L1 has one end thereof electrically connected to a first electrode 3a of the light-emitting device 3 and the other end thereof led out to a surface of the base body 1. In the construction illustrated in FIG. 18, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 18, the other end of the second electrically conductive path L2 is formed on the mounting surface, namely the lower surface, of the base body 1.

As shown in FIG. 18, in the light-emitting apparatus of this embodiment, the area of joint region between the first electrically conductive path L1 having a plurality of electrical conductors 2 and the first electrode 3a of the light-emitting device 3 is set to be larger than the area of joint region between the second electrically conductive path L2 and the second electrode 3b of the light-emitting device 3. Moreover, the distance between the first and second electrically conductive paths L1 and L2 on a common plane is set to be longer than the distance between the first and second electrodes 3a and 3b of the light-emitting device 3 that are bonded to the base body 1.

In this construction, the heat emanating from the light-emitting device 3 is dissipated efficiently from the light-emitting apparatus to the outside through the first electrically conductive path L1. This leads to excellent heat-dissipation capability. Moreover, the heat can be inhibited from remaining in the region between the base body 1 and the first and second electrically conductive paths L1 and L2, wherefore development of a stress due to the difference in thermal expansion coefficient there between can be suppressed successfully. Note that the twelfth embodiment is otherwise similar to the first embodiment in terms of configuration and working.

Thirteenth Embodiment

Figure 19:
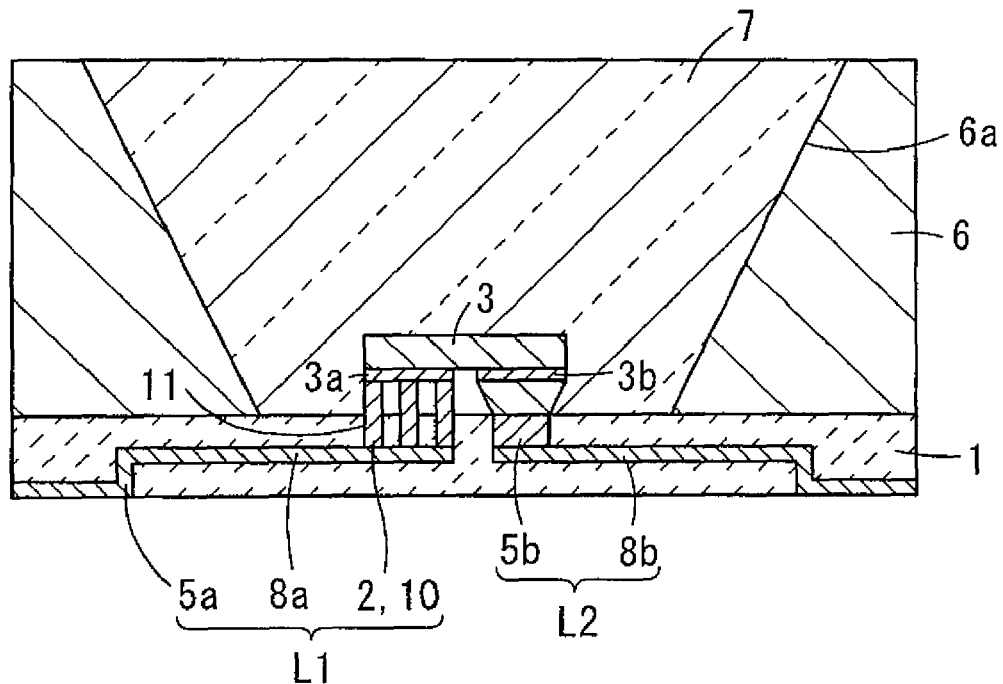
FIG. 19 is a sectional view showing a light-emitting apparatus in accordance with a thirteenth embodiment of the invention.

FIG. 19 is a sectional view showing a light-emitting device mounting substrate and a light-emitting apparatus incorporating the substrate in accordance with a thirteenth embodiment of the invention.

As shown in FIG. 19, in the light-emitting apparatus of the thirteenth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a. The first electrically conductive path L1 has one end thereof electrically connected to a first electrode 3a of the light-emitting device 3 and the other end thereof led out to a surface of the base body 1. In the construction illustrated in FIG. 19, the other end of the first electrically conductive path L1 is led out to the mounting surface, namely the lower surface, of the base body 1.

The second electrically conductive path L2 is composed of a second via conductor 5b formed by filling a via hole with an electrically conductive material and a wiring conductor 8b. The second electrically conductive path L2 has one end thereof electrically connected to a second electrode 3b of the light-emitting device 3 and the other end thereof formed on a surface of the base body 1. In the construction illustrated in FIG. 19, the other end of the second electrically conductive path L2 is formed on the mounting surface, namely the lower surface, of the base body 1.

As shown in FIG. 19, in the light-emitting apparatus of this embodiment, certain portions of the base body 1 have a smaller thickness than others because of creation of a plurality of holes 11. A plurality of electrical conductors 2 are formed in the smaller-thickness portions of the base body 1, namely in a plurality of holes 11, respectively. The area of joint region between the first electrode 3a and a plurality of electrical conductors 2 is set to be larger than the area of joint region between the second electrode 3b and the second electrically conductive path L2. Note that a connecting agent 10 portion contained inside the hole 11 acts as the electrical conductor 2.

In this construction, the heat emanating from the light-emitting device 3 is dissipated efficiently from the light-emitting apparatus to the outside through the first electrically conductive path L1. This leads to excellent heat-dissipation capability. Moreover, the heat can be inhibited from remaining in the region between the base body 1 and the first and second electrically conductive paths L1 and L2, wherefore development of a stress due to the difference in thermal expansion coefficient there between can be suppressed successfully. Note that the thirteenth embodiment is otherwise similar to the first embodiment in terms of configuration and working.

Fourteenth Embodiment

Figure 20:
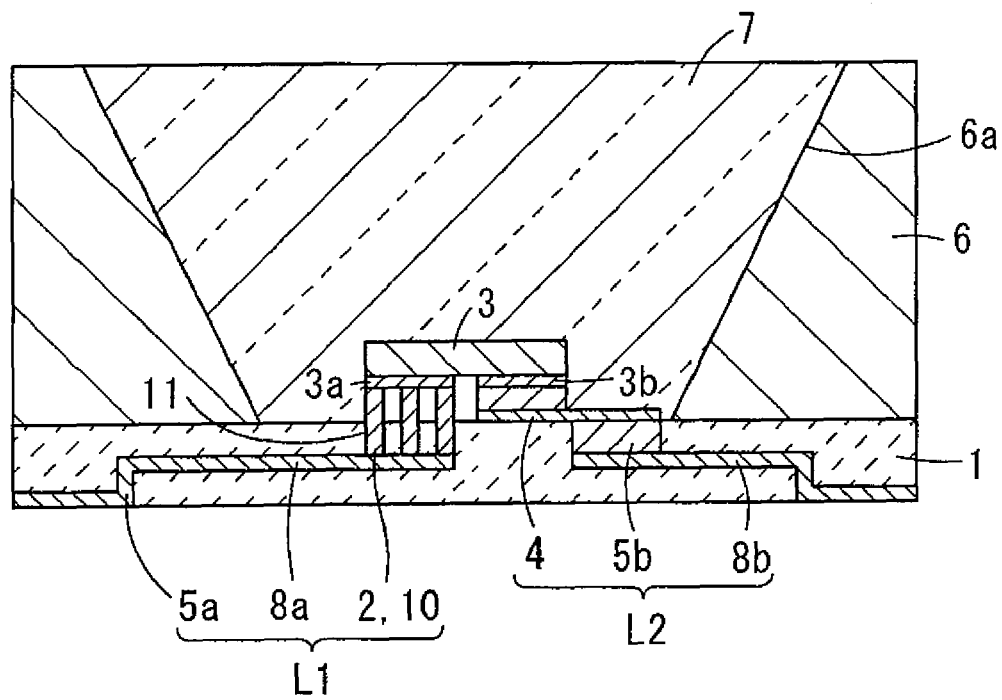
FIG. 20 is a sectional view showing a light-emitting apparatus in accordance with a fourteenth embodiment of the invention.

FIG. 20 is a sectional view showing a light-emitting device mounting substrate and a light-emitting apparatus incorporating the substrate in accordance with a fourteenth embodiment of the invention.

As shown in FIG. 20, in the light-emitting apparatus of the fourteenth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting-substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a. The first electrically conductive path L1 has one end thereof electrically connected to a first electrode 3a of the light-emitting device 3 and the other end thereof led out to a surface of the base body 1. In the construction illustrated in FIG. 20, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 20, the other end of the second electrically conductive path L2 is formed on the mounting surface, namely the lower surface, of the base body 1.

As shown in FIG. 20, in the light-emitting apparatus of this embodiment, certain portions of the base body 1 have a smaller thickness than others because of creation of a plurality of holes 11. A plurality of electrical conductors 2 are exposedly located in the smaller-thickness portions of the base body 1, namely in a plurality of holes 11, respectively. Moreover, the distance between the first and second electrically conductive paths L1 and L2 on a common plane is set to be longer than the distance between the first and second electrodes 3a and 3b of the light-emitting device 3 that are bonded to the base body 1. Note that a connecting agent 10 portion contained inside the hole 11 acts as the electrical conductor 2.

In this construction, the heat emanating from the light-emitting device 3 is dissipated efficiently from the light-emitting apparatus to the outside through the first electrically conductive path L1. This leads to excellent heat-dissipation capability. Moreover, the heat can be inhibited from remaining in the region between the base body 1 and the first and second electrically conductive paths L1 and L2, wherefore development of a stress due to the difference in thermal expansion coefficient there between can be suppressed successfully. Note that the fourteenth embodiment is otherwise similar to the first embodiment in terms of configuration and working.

Fifteenth Embodiment

Figure 21:
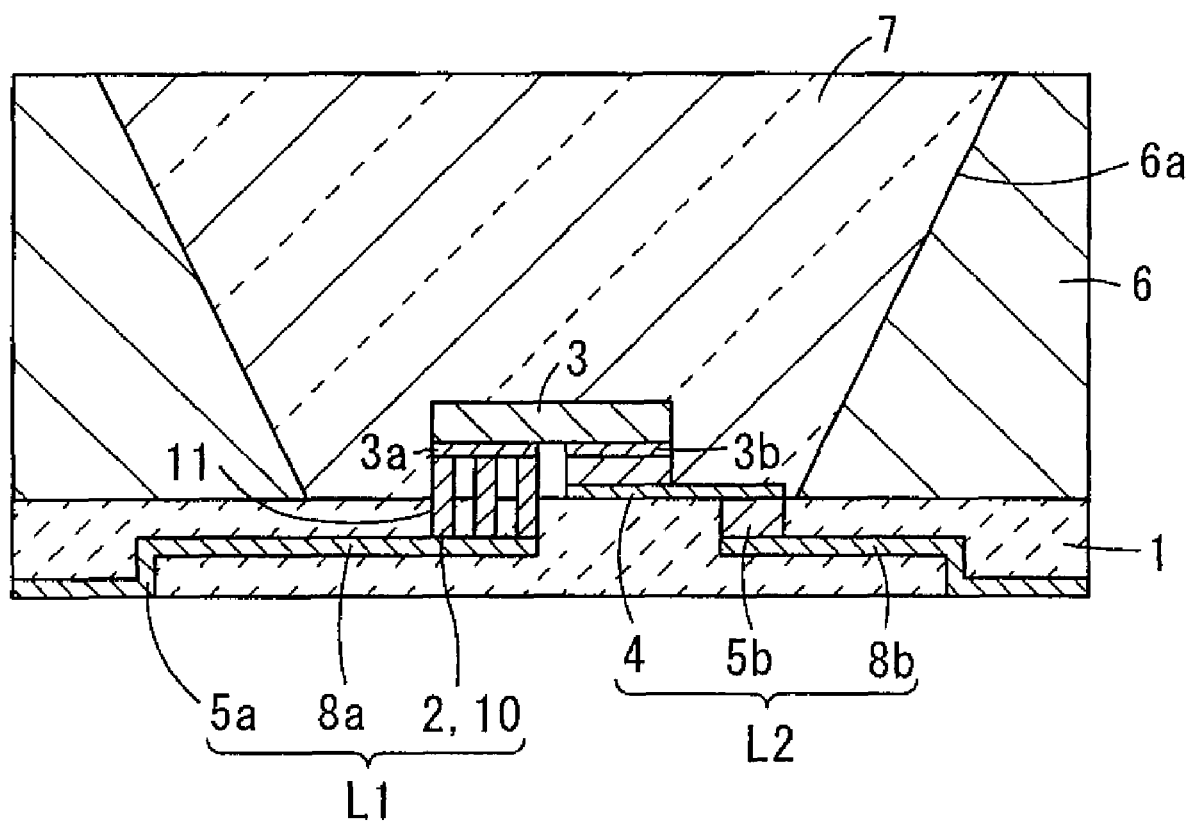
FIG. 21 is a sectional view showing a light-emitting apparatus in accordance with a fifteenth embodiment of the invention.

FIG. 21 is a sectional view showing a light-emitting device mounting substrate and a light-emitting apparatus incorporating the substrate in accordance with a fifteenth embodiment of the invention.

As shown in FIG. 21, in the light-emitting apparatus of the fifteenth embodiment, a light-emitting device 3 is mounted inside an opening formed in a light-emitting device housing package. Moreover, a light-transmittable member 7 is disposed inside the opening of the package so as to cover the light-emitting device 3. The light-emitting device housing package is composed of a light-emitting device mounting substrate and a light reflection portion 6 disposed on a surface of the light-emitting device mounting substrate so as to surround the region in which is mounted the light-emitting device 3.

The light-emitting device mounting substrate is composed of a base body 1 which mounts thereon the light-emitting device 3, a first electrically conductive path L1 formed inside the base body 1, and a second electrically conductive path L2 formed in the base body 1. The first electrically conductive path L1 is made smaller in thermal resistance than the second electrically conductive path L2.

The first electrically conductive path L1 is composed of a plurality of electrical conductors 2, a first via conductor 5a formed by filling a via hole with an electrically conductive material, and a wiring conductor 8a. The first electrically conductive path L1 has one end thereof electrically connected to a first electrode 3a of the light-emitting device 3 and the other end thereof led out to a surface of the base body 1. In the construction illustrated in FIG. 21, the other end of the first electrically conductive path L1 is led out to the mounting surface, namely the lower surface, of the base body 1.

The second electrically conductive path L2 is composed of a lead wiring line 4, a second via conductor 5b formed by filling a via hole with an electrically conductive material, and a wiring conductor 8b. The second electrically conductive path L2 has one end thereof electrically connected to a second electrode 3b of the light-emitting device 3 and the other end thereof formed on a surface of the base body 1. In the construction illustrated in FIG. 21, the other end of the second electrically conductive path L2 is formed on the mounting surface, namely the lower surface, of the base body 1.

As shown in FIG. 21, in the light-emitting apparatus of this embodiment, certain portions of the base body 1 have a smaller thickness than others because of creation of a plurality of holes 11. A plurality of electrical conductors 2 are exposedly located in the smaller-thickness portions of the base body 1, namely in a plurality of holes 11, respectively. The area of joint region between the first electrically conductive path L1 and the first electrode 3a of the light-emitting device 3 is set to be larger than the area of joint region between the second electrically conductive path L2 and the second electrode 3b of the light-emitting device 3. Moreover, the distance between the first and second electrically conductive paths L1 and L2 on a common plane is set to be longer than the distance between the first and second electrodes 3a and 3b of the light-emitting device 3 that are bonded to the base body 1.

In this construction, the heat emanating from the light-emitting device 3 is dissipated efficiently from the light-emitting apparatus to the outside through the first electrically conductive path L1. This leads to excellent heat-dissipation capability. Moreover, the heat can be inhibited from remaining in the region between the base body 1 and the first and second electrically conductive paths L1 and L2, wherefore development of a stress due to the difference in thermal expansion coefficient there between can be suppressed successfully.

Note that the fifteenth embodiment is otherwise similar to the first embodiment in terms of configuration and working.

In order that the light-emitting apparatus of the invention implemented by way of various embodiments may be used to constitute an illuminating apparatus, a few ways will be considered, i.e. setting up a single piece of the light-emitting apparatus in a predetermined arrangement as a light source; setting up a plurality of the light-emitting apparatuses in a predetermined arrangement such as a lattice configuration, staggered configuration, and radial configuration as light sources; and setting up a plurality of concentrically-arranged circular or polygonal light-emitting apparatus units, each of which is composed of a plurality of the light-emitting apparatuses, in a predetermined arrangement.

In the illuminating apparatus according to the invention, light emission is effected by exploiting recombination of electrons in the light-emitting device 3 composed of a semiconductor. Accordingly, the illuminating apparatus of the invention has the advantage, in terms of power saving and long lifetime, over a conventional illuminating apparatus for effecting light emission through electrical discharge. Moreover, the illuminating apparatus of the invention can be realized as a compact, low heat-generation illuminating apparatus. As a result, several advantages are gained by the use of the illuminating apparatus of the invention: variation in the center wavelength of light emitted from the light-emitting device 3 can be suppressed; the light can be irradiated with stable radiation light intensity and radiation light angle (luminous intensity distribution) for a longer period of time; and color unevenness and unbalanced illumination distribution on a to-be-irradiated surface can be suppressed.

Moreover, by setting up the light-emitting apparatuses of the invention in a predetermined arrangement as light sources, followed by arranging around the light-emitting apparatus arrangement a certain component optically designed in a given configuration such as a reflection jig, an optical lens, a light diffusion plate, and so forth, it is possible to realize an illuminating apparatus which is capable of emitting light with given luminous intensity distribution.

Figure 22:
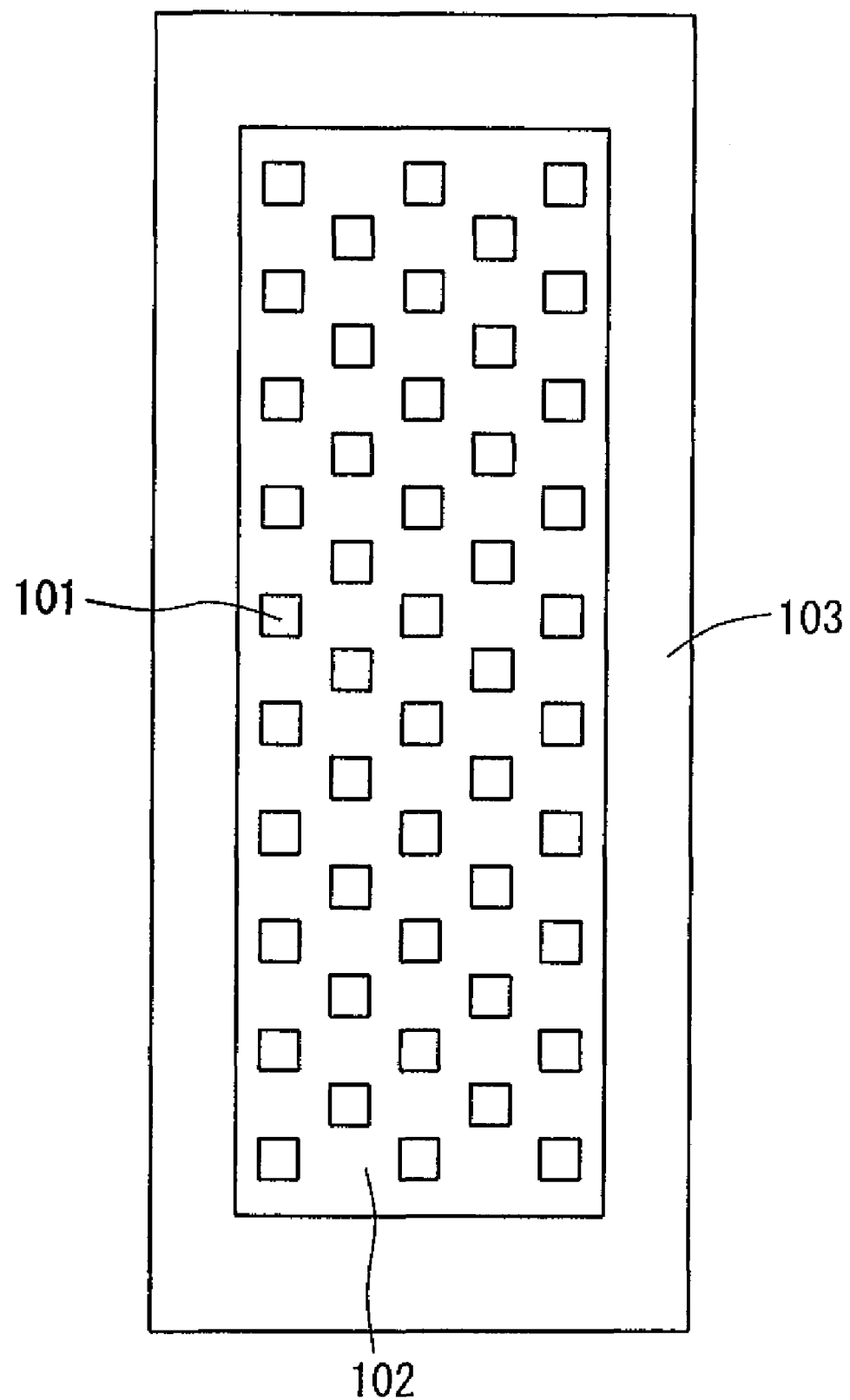
FIG. 22 is a plan view showing an illuminating apparatus in accordance with one embodiment of the invention.

For example, FIGS. 22 and 23 show a plan view and a sectional view, respectively, of an illuminating apparatus composed of a plurality of light-emitting apparatuses 101 arranged in rows and columns on a light-emitting apparatus drive circuit base substrate 102 and a reflection jig 103 optically designed in a given configuration that is disposed around the light-emitting apparatuses 101. In this construction, it is preferable that the adjacent arrays of a plurality of the light-emitting apparatuses 101 are so arranged as to secure as sufficient a spacing as possible between the adjacent light-emitting apparatuses 101, that is; the light emitting apparatuses 101 are arranged in a staggered configuration. Specifically, in the case of arranging the light-emitting apparatuses 101 in a lattice configuration, since the light-emitting apparatuses 101 acting as light sources are placed side by side in a straight line, it follows that intense glare may arise. The light emitted from such an illuminating apparatus tends to bring discomfort to human eyes. In view of the foregoing, by adopting the staggered configuration for arranging the light-emitting apparatuses 101 in the illuminating apparatus, it is possible to suppress glare and thereby reduce discomfort to human eyes.

Moreover, in this construction, since a sufficient interval can be secured between the adjacent light-emitting apparatuses 101, it is possible to reduce thermal interference between the adjacent light-emitting apparatuses 101. This helps prevent heat from remaining in the light-emitting apparatus drive circuit base substrate 102 on which are mounted the light-emitting apparatuses 101, wherefore the heat can be dissipated from the light-emitting apparatuses 101 to the outside efficiently. As a result, it is possible to produce a long-life illuminating apparatus which offers stable optical characteristics for a longer period of time.

Figure 24:
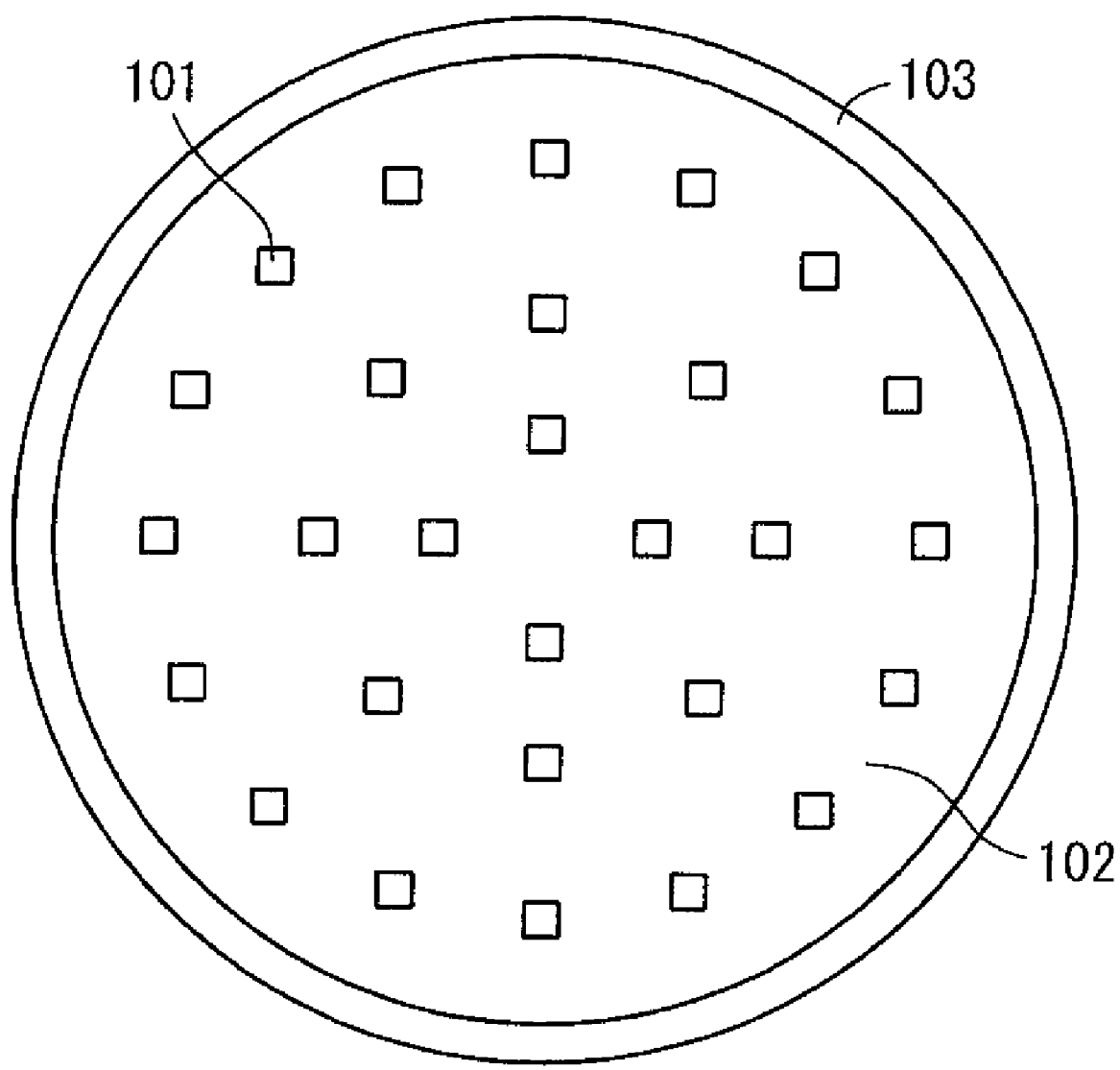
FIG. 24 is a plan view showing an illuminating apparatus in accordance with another embodiment of the invention.
Figure 25:
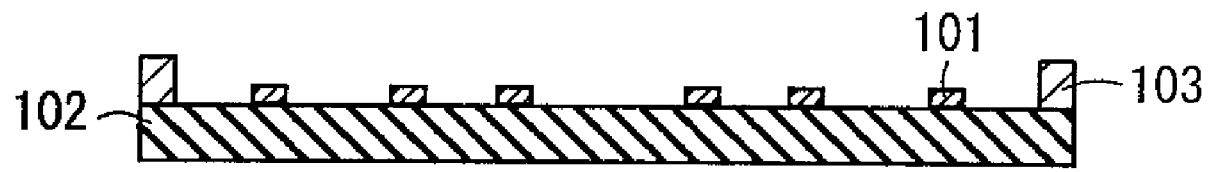
FIG. 25 is a sectional view of the illuminating apparatus depicted in FIG. 24.

On the other hand, FIGS. 24 and 25 show a plan view and a sectional view, respectively, of an illuminating apparatus constructed by disposing, on a light-emitting apparatus drive circuit board 102, a plurality of concentrically-arranged circular or polygonal light-emitting apparatus 101 units each of which is composed of a plurality of the light-emitting apparatuses 101. In this construction, it is preferable that, in a single circular or polygonal light-emitting apparatus 101 unit, the light-emitting apparatuses 101 are so arranged that the number thereof becomes larger gradually from the center to the outer periphery of the illuminating apparatus. This makes it possible to arrange the light-emitting apparatuses 101 as many as possible while securing an appropriate spacing between the adjacent light-emitting apparatuses 101, and thereby enhance the illumination level of the illuminating apparatus. As another advantage, since the light-emitting apparatuses 101 are arranged centrally of the illuminating apparatus at a lower density, it is possible to prevent heat from remaining in the midportion of the light-emitting apparatus drive circuit board 102. Accordingly, the interior of the light-emitting apparatus drive circuit board 102 exhibits uniform temperature distribution, wherefore heat can be transmitted efficiently to an external electric circuit board on which the illuminating apparatus is installed or a heat sink. That is, it never occurs that the light-emitting apparatus 101 is subjected to a temperature rise. As a result, it is possible to produce a long-life illuminating apparatus in which the light-emitting apparatuses 101 can be operated with stability for a longer period of time.

The illuminating apparatus such as shown herein will find a wide range of applications including: general-purpose lighting fixtures for indoor or outdoor use: illumination lamps for chandeliers; home-use lighting fixtures; office-use lighting fixtures; store-use lighting fixtures; lighting fixtures for display purposes; street lighting fittings; guidance lights; signal light devices; lighting fixtures for stage or studio use; advertisement lights; illumination poles; underwater illumination lights; stroboscopic lights; spotlights; security lighting fixtures embedded in electric poles or the like; lighting fixtures for emergency purposes; electric torches; electric bulletin boards; dimmers; automatic blink switches; backlights for display or other purposes; motion picture devices; ornamental articles; lighted switches; light sensors; lights for medical use; and vehicle-mounted lights.

It is to be understood that the application of the invention is not limited to the embodiments described heretofore, and that many modifications and variations of the invention are possible within the spirit and scope of the invention. For example, an optical lens or a platy light-transmittable lid body may additionally be bonded to the reflection member 2 with use of solder, a resin adhesive, or the like agent. In this case, since the optical lens or light-transmittable lid body is capable of condensing and diffusing freely the light emitted from the light-emitting apparatus, it is possible to produce light at a desired radiation angle. Moreover, the resistance of the interior of the light-emitting apparatus to immersion can be increased. This contributes to enhanced long-term reliability.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, in the light-emitting device mounting substrate, the first electrically conductive path which is connected to the first electrode of the light-emitting device is made smaller in thermal resistance than the second electrically conductive path which is connected to the second electrode of the light-emitting device. In this construction, of a plurality of electrodes formed in the light-emitting device, a specific one, for example, the first electrode, is allowed to dissipate heat transmitted thereto with higher heat-dissipation efficiency. This makes it possible to enhance the luminous efficiency of the light-emitting apparatus.

That is, in the light-emitting device mounting substrate of the invention, the heat transmitted to a specific electrode of the light-emitting device, for example, the first electrode, can be dissipated from the light-emitting apparatus to the outside properly through the first electrically conductive path which exhibits lower thermal resistance than does the second electrically conductive path. This makes it possible to enhance the luminous efficiency of the light-emitting apparatus.

The invention claimed is:

1. A light-emitting device mounting substrate comprising:
   a base body which mounts thereon a light-emitting device;
   a first electrically conductive path formed within the base body, one end of the first electrically conductive path being electrically connected to a first electrode of the light-emitting device, and the other end thereof being led out to a surface of the base body; and
   a second electrically conductive path formed in the base body, one end of the second electrically conductive path being electrically connected to a second electrode of the light-emitting device, and the other end thereof being formed on the surface of the base body,
   wherein the first electrically conductive path includes a plurality of electrical conductors which are joined to the first electrode of the light emitting device,
   a total area of joint region between the first electrode of the light-emitting device and each of a plurality of the electrical conductors is set to be larger than the total area of joint region between the first electrode of the light-emitting device and the base body, and
   the first electrically conductive path is made smaller in thermal resistance than the second electrically conductive path.

2. A light-emitting apparatus comprising:
   a light-emitting device;
   a base body having mounted thereon the light-emitting device;
   a first electrically conductive path formed within the base body, one end of the first electrically conductive path being electrically connected to a first electrode of the light-emitting device, and the other end thereof being led out to a surface of the base body;
   a second electrically conductive path formed in the base body, one end of the second electrically conductive path being electrically connected to a second electrode of the light-emitting device, and the other end thereof being formed on the surface of the base body; and
   a light reflection portion formed so as to surround the light-emitting device,
   wherein the first electrically conductive path includes a plurality of electrical conductors which are joined to the first electrode of the light emitting device,
   a total area of joint region between the first electrode of the light-emitting device and each of a plurality of the electrical conductors is set to be larger than the total area of joint region between the first electrode of the light-emitting device and the base body, and
   the first electrically conductive path is made smaller in thermal resistance than the second electrically conductive path.

* * * * *